United States Patent
Verhaverbeke et al.

(10) Patent No.: US 7,718,009 B2
(45) Date of Patent: May 18, 2010

(54) CLEANING SUBMICRON STRUCTURES ON A SEMICONDUCTOR WAFER SURFACE

(75) Inventors: Steven Verhaverbeke, San Francisco, CA (US); Jianshe Tang, San Jose, CA (US); Roman Gouk, San Jose, CA (US); Brian J. Brown, Palo Alto, CA (US); Han-Wen Chen, Santa Clara, CA (US); Ching-Hwa Weng, Taipei County (TW); James S. Papanu, San Rafael, CA (US); Dennis Yost, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1471 days.

(21) Appl. No.: 10/931,093

(22) Filed: Aug. 30, 2004

(65) Prior Publication Data

US 2006/0042651 A1 Mar. 2, 2006

(51) Int. Cl.
*C23G 1/02* (2006.01)

(52) U.S. Cl. .................................. 134/3; 134/2; 134/33

(58) Field of Classification Search ........................ None
See application file for complete search history.

(56) References Cited

U.S. PATENT DOCUMENTS

| | | | | |
|---|---|---|---|---|
| 4,092,176 A * | 5/1978 | Kozai et al. | ............... | 134/186 |
| 4,220,706 A | 9/1980 | Spak | | |
| 4,581,102 A | 4/1986 | Brock | | |
| 4,900,398 A | 2/1990 | Chen | | |
| 5,294,570 A | 3/1994 | Fleming, Jr. et al. | | |
| 6,162,739 A * | 12/2000 | Sumnitsch et al. | ............. | 438/745 |
| 6,273,959 B1 | 8/2001 | Oonishi et al. | | |
| 6,313,014 B1 * | 11/2001 | Sakaguchi et al. | ............ | 438/475 |
| 6,413,923 B2 | 7/2002 | Honda et al. | | |
| 6,417,147 B2 | 7/2002 | Amemiya et al. | | |
| 6,461,978 B1 | 10/2002 | Jo | | |
| 6,517,738 B1 | 2/2003 | Torek et al. | | |
| 6,534,458 B1 | 3/2003 | Kakizawa et al. | | |
| 6,592,677 B1 * | 7/2003 | Tomimori et al. | ............... | 134/3 |
| 6,630,074 B1 * | 10/2003 | Rath et al. | ............... | 252/79.3 |
| 6,683,381 B2 | 1/2004 | Harada | | |
| 6,684,891 B2 | 2/2004 | Bran | | |
| 6,689,418 B2 | 2/2004 | Mok et al. | | |

(Continued)

OTHER PUBLICATIONS

Treadwell, Analytical Chemistry, Wiley, 5th Edition, p. 227.*

(Continued)

*Primary Examiner*—Michael Cleveland
*Assistant Examiner*—Nicole Blan
(74) *Attorney, Agent, or Firm*—Blakely Sokoloff Taylor & Zafman, LLP

(57) ABSTRACT

Cleaning solutions and cleaning methods targeted to particular substrates and structures in semiconductor fabrication are described. A method of cleaning fragile structures having a dimension less than 0.15 um with a cleaning solution formed of a solvent having a surface tension less than water while applying acoustic energy to the substrate on which the structures are formed is described. Also, a method of cleaning copper with several different cleaning solutions, and in particular an aqueous sulfuric acid and HF cleaning solution, is described. Also, methods of cleaning both sides of a substrate at the same time with different cleaning solutions applied to the top and the bottom are described.

19 Claims, 33 Drawing Sheets

U.S. PATENT DOCUMENTS

| | | | |
|---|---|---|---|
| 6,702,202 B1* | 3/2004 | Boyd et al. | 239/225.1 |
| 6,723,691 B2 | 4/2004 | Naghshineh et al. | |
| 2002/0066475 A1* | 6/2002 | Verhaverbeke et al. | 134/153 |
| 2002/0066717 A1* | 6/2002 | Verhaverbeke et al. | 216/13 |
| 2002/0084529 A1* | 7/2002 | Dubin et al. | 257/774 |
| 2002/0102852 A1* | 8/2002 | Verhaverbeke et al. | 438/690 |
| 2002/0111037 A1* | 8/2002 | Kirkpatrick et al. | 438/763 |
| 2003/0077903 A1* | 4/2003 | Andreas et al. | 438/687 |
| 2004/0000322 A1* | 1/2004 | Verhaverbeke | 134/1.3 |
| 2004/0069319 A1* | 4/2004 | Boyd et al. | 134/1.3 |
| 2006/0234508 A1* | 10/2006 | Shirakashi et al. | 438/691 |

OTHER PUBLICATIONS

Treadwell, Analytical Chemistry, 1921, Wiley, $5^{th}$ Edition, p. 227.*

Website: Semiconductor OneSource: Semiconductor Glossary—Low K Dielectric, May 27, 2008.

* cited by examiner

707

708

709

CLEANING SUBMICRON STRUCTURES ON A SEMICONDUCTOR WAFER SURFACE

BACKGROUND OF THE INVENTION

1. Field of the Invention

The present invention relates to the field of semiconductor processing and more particularly to cleaning a semiconductor substrate with cleaning solutions tailored to clean particular surfaces on the semiconductor substrate during processing.

2. Discussion of Related Art

The surfaces of semiconductor substrates may be cleaned at several points during the fabrication of structures on the semiconductor substrates. The cleaning requirements vary for different materials and different structures. The cleaning requirements for surfaces before metallization (front-end-of-the-line) may be different from the cleaning requirements after metallization (back-end-of-the-line). In the past, front-end-of-the-line (FEOL) cleaning was performed using aqueous solutions. In the FEOL, shallow trench isolation structures and gate or memory stacks are typically formed. These structures are fragile due to their increasingly small dimensions and the types of materials used to form the structures. The back-end-of-the-line (BEOL) may also have fragile submicron structures such as dual damascene etched openings in low-k dielectric materials or polysilicon interconnect lines. In particular, structures having a dimension of 0.15 µm or less, require special cleaning considerations. Polysilicon is a fragile material, particularly when it is part of a gate stack formed on a thin silicon oxide layer. In the past, fragile structures in the FEOL were cleaned using aqueous solutions such as SC1 without any additional agitation such as acoustic energy. The use of acoustic energy was found to cause significant damage in combination with aqueous solutions. For example, the use of acoustic energy in combination with aqueous solutions may cause the loss of entire portions 110 of polysilicon lines 100 as illustrated in FIG. 1a. But, using only an aqueous solution does not adequately clean the surfaces of submicron structures having a dimension of 0.15 µm or less and therefore may cause the loss of critical dimension control and ultimately cause lower yields.

In the past, BEOL substrates containing copper were cleaned with basic amine containing cleaning solutions. These cleaning solutions typically contained a solvent, an amine to remove organic residues, a fluoride ion to remove oxide and copper residues, and an inhibitor to prevent copper etching by the amine. Solvent based cleaning solutions were used because they were effective at removing large amounts of photoresist residues present after the etching steps. As technology has advanced, the need to remove large amounts of photoresist residues has been reduced. Photoresists are now typically removed by plasma ashing and very few photoresist residues are left behind. Therefore, the use of the basic, solvent-based and amine containing cleaning solutions are no longer necessary but are still typically used. Because the residues remaining after photoresist removal are now mainly inorganic rather than organic the use of amines is not required. Also, because the amine based cleaning solution was developed for removing mainly organic residues, it is not as effective at cleaning mostly inorganic residues. Additionally, the amines left over after cleaning may cause photoresist poisoning in later steps. Additionally, the solvents and the chemical additives used in amine-based cleaning solutions are expensive and difficult to dispose of in an environmentally friendly manner. Aqueous solutions such as hydrofluoric acid in water and oxalic acid in water have been used to clean dual damascene structures, but due to the surface tension an aqueous solution 125 may distort or pull down the interlayer dielectric 115, as illustrated at 120 in FIG. 1b. Additionally, the aqueous HF cleaning solution and the aqueous oxalic acid cleaning solution do not remove residues to the extent necessary to provide the desired critical dimension control and improved yield.

BEOL copper processing often uses a dual damascene process including many steps at which the wafer is cleaned, both front and back. In the past, to clean both sides of the wafer in a single wafer cleaning tool would require the removal and flipping of the wafer. Also, both sides of the wafer have been cleaned in a single wafer cleaning tool by spraying cleaning solutions on both the top 130 and the bottom 135 of a wafer 140, as illustrated in FIG. 1c. Cleaning both sides of the wafer using the dual spray method has the drawback of the splashing 145 caused by spraying a cleaning solution onto the bottom of a wafer. The splashing will result in the mixing of the cleaning solution applied to the top 130 and the bottom 135 of the wafer 140, therefore making it difficult to use two different cleaning solutions on the top and the bottom of the wafer, particularly where the mixing of the two cleaning solutions would result in the degradation of one or both of the cleaning solutions.

SUMMARY OF THE INVENTION

Methods and solutions for cleaning submicron features on a semiconductor substrate are described. In one embodiment, fragile structures having a dimension of less than 0.15 µm are cleaned with a cleaning solution having a low surface tension in combination with acoustic energy. In another embodiment, a substrate having metallization is cleaned with a solution comprising sulfuric acid, hydrofluoric acid, and enhancers including a surfactant and a chelate. The surfactant may be a mixture of a polyoxyalkylene ether and an ethoxylated alcohol. Also, the sulfuric acid used in the cleaning solution may be prediluted to expend the heat energy created by diluting sulfuric acid. Additionally, the sulfuric acid may be mixed at a point of use with the other components of the cleaning solution. In a further embodiment, both sides of a substrate having metallization are cleaned by applying cleaning solutions to the front and the back of the wafer while spinning the substrate at a particular spin rate and applying megasonics to the substrate. In yet another embodiment, a cleaning solution formed of sulfuric acid and hydrofluoric acid, a cleaning solution formed of acetic acid and water, or a cleaning solution formed of tetramethyl ammonium hydroxide may be formulated.

DETAILED DESCRIPTION OF THE PRESENT INVENTION

Figure 1A:
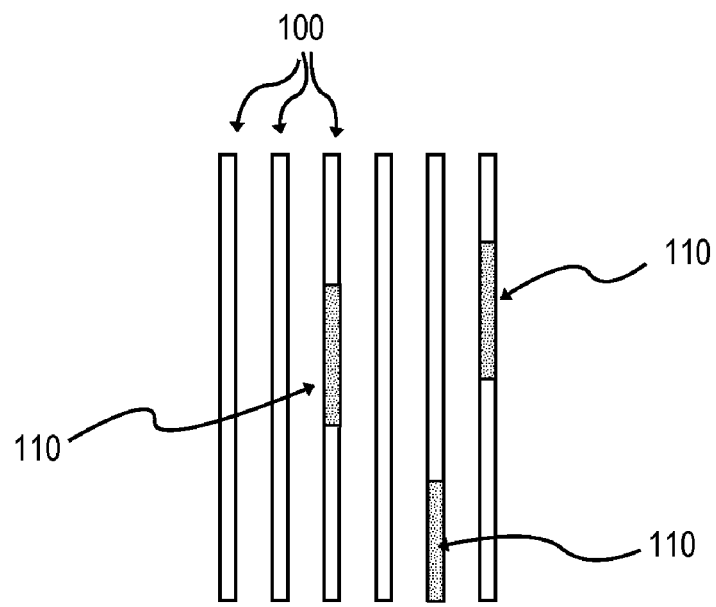
FIG. 1a is an illustration of an overhead view of polysilicon lines that have been damaged during cleaning.
Figure 1B:
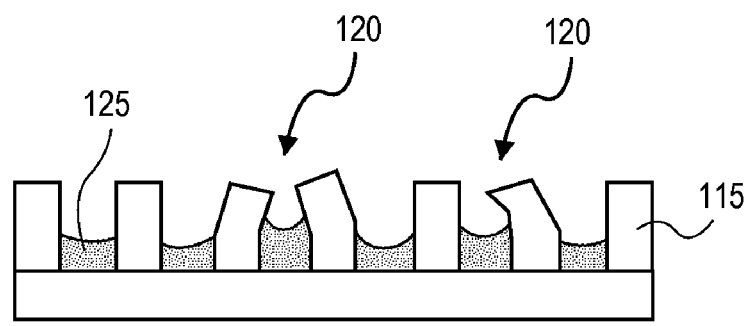
FIG. 1b is an illustration of a cross-sectional view of the effects of a cleaning solution having a high surface tension on a dielectric material.
Figure 1C:
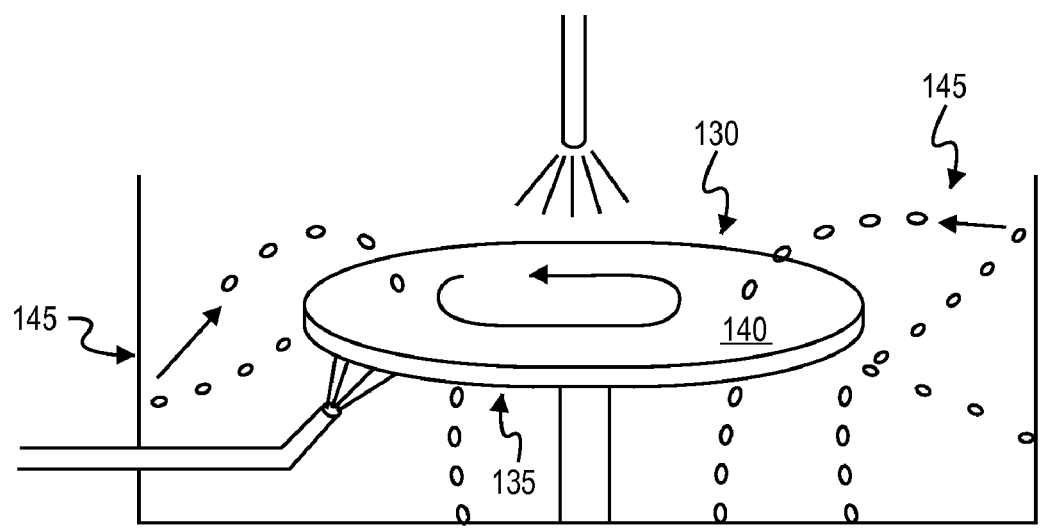
FIG. 1c is an illustration of side view of a prior art single wafer cleaning apparatus where cleaning solutions are sprayed on the top and the bottom of the wafer.

In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-known processing techniques and equipment have not been set forth in particular detail in order to not unnecessarily obscure the present invention.

Fragile structures having a dimension below 0.15 µm and fragile materials such as polysilicon may be cleaned with a cleaning solution in combination with acoustic energy without harming the structures by formulating a cleaning solution from a solvent having a surface tension lower than that of water. This cleaning solution formulated from a solvent having a surface tension lower than that of water may be used to clean structures formed during front-end-of-the-line (FEOL) processing. In one embodiment, FEOL processing may be used to form a CMOS transistor. One type of fragile structure formed during FEOL processing is shallow trench isolation (STI) trenches. STI trenches may be formed as illustrated in FIGS. 3a-3b and as described in the flowchart of FIG. 2a. At block 201 of FIG. 2a a pad oxide 330 is grown on a monocrystalline semiconductor substrate 300 as illustrated in FIG. 3a at 301. The monocrystalline semiconductor substrate 300 may be, for example, a wafer formed of silicon, germanium, or silicon-on-insulator (SOI). At block 202 a nitride layer 332 is formed over the oxide layer 330, as illustrated at 302, by low pressure chemical vapor deposition (LPCVD). A photoresist 334 is then deposited over the substrate 300 on the nitride layer 332 by a spin-on process. A mask 336 is then formed over the photoresist 334 so that the photoresist may be patterned as illustrated in FIG. 3b at 305. The oxide layer 330 and the nitride layer 332 are then etched at block 204 as illustrated in 306 of FIG. 3b. The monocrystalline semiconductor substrate 300 may then be anisotropically etched at block 205 to a depth of approximately 400 nm to 500 nm to form the STI trenches 342 as illustrated in 307. The photoresist 334 is then removed at block 206. The photoresist 334 may be removed by a wet solution or by a plasma ash. The photoresist may be removed by a wet solution such as a mixture of sulfuric acid and hydrogen peroxide. The plasma ash may be oxygen ($O_2$) or hydrogen ($H_2$). The distance 343 between the STI trenches 342 illustrated at 308 of FIG. 3b may be on the submicron scale and may be cleaned with a cleaning solution formed with a solvent having a surface tension less than that of water and acoustic energy at block 207.

Figure 4:
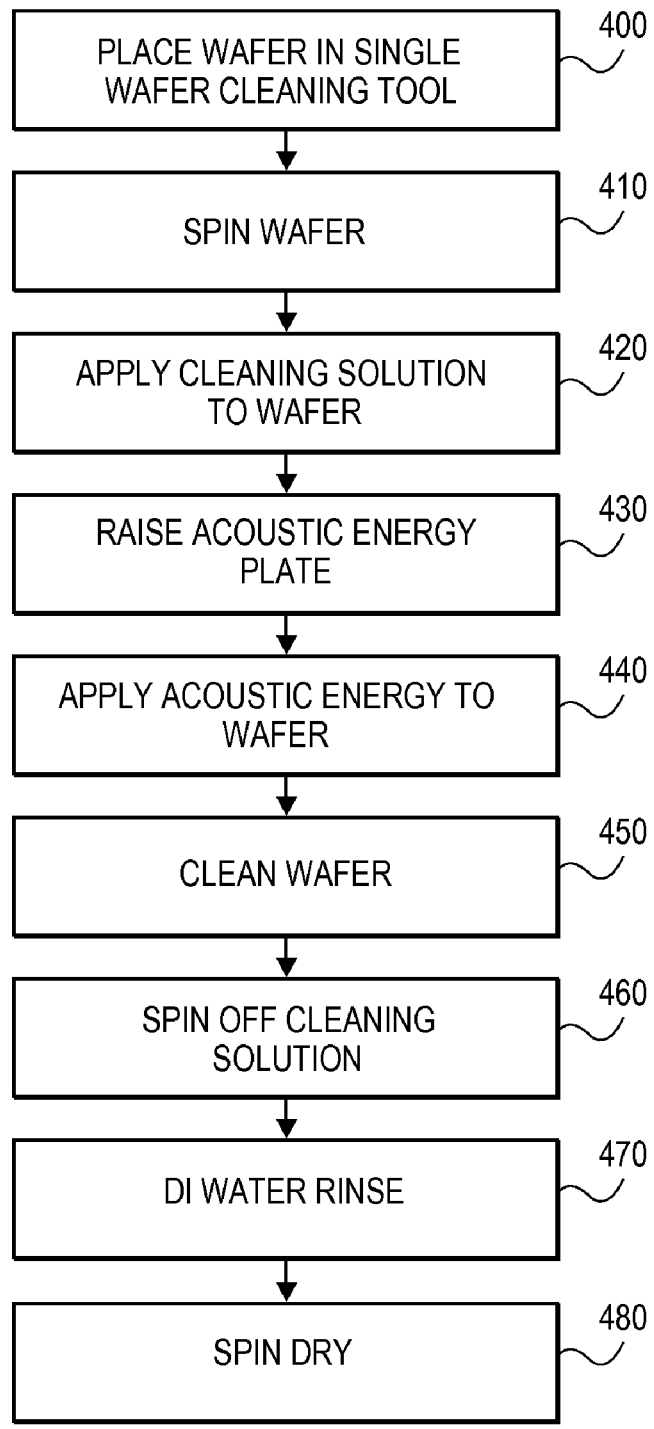
FIG. 4 is a flow chart of a cleaning process that may be used with front-end-of-the-line processing.
Figure 5A:
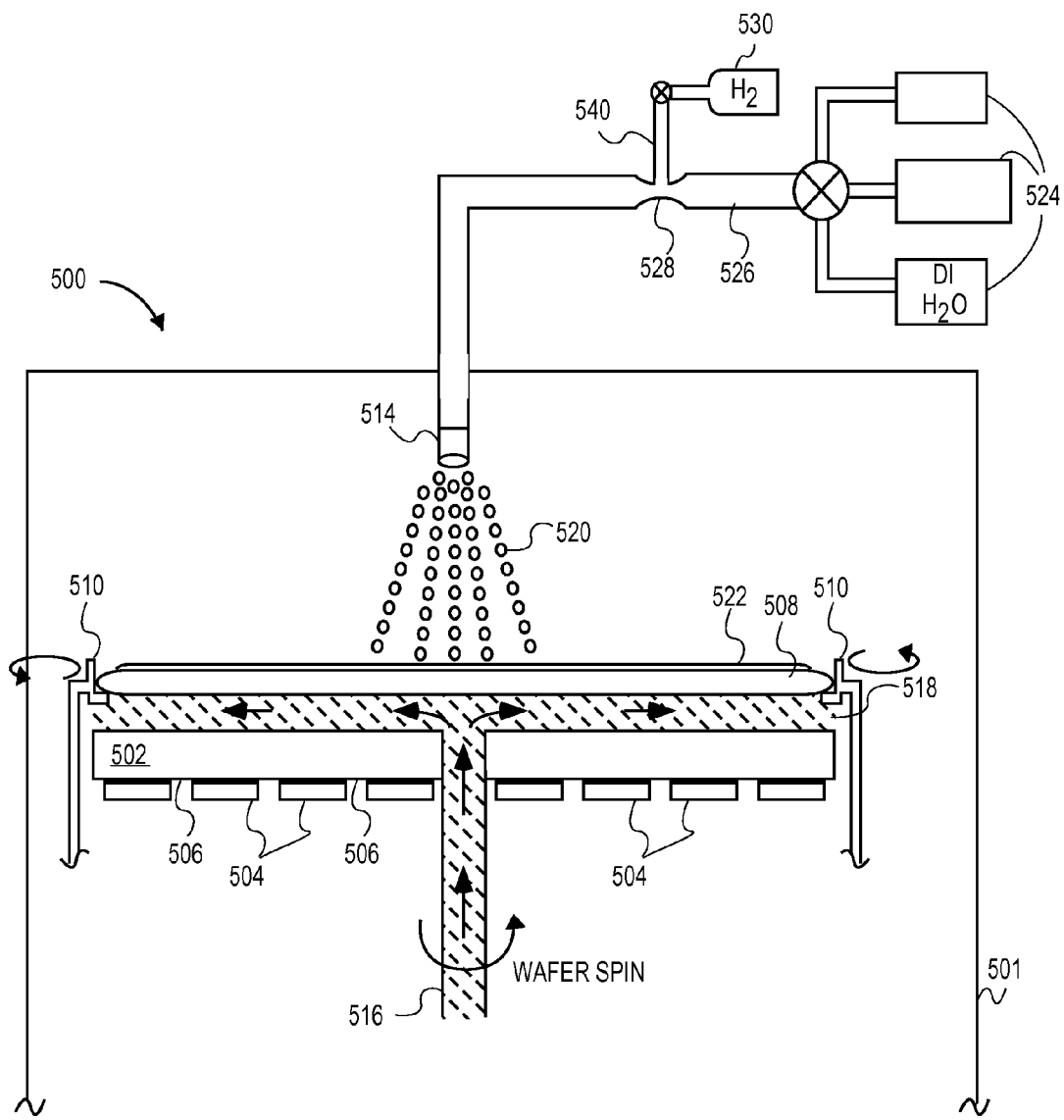
FIG. 5a is a cross-sectional view of a single substrate cleaning tool.

The cleaning process is described in the flowchart of FIG. 4. At block 400 of FIG. 4, the substrate on which the STI trenches 342 are formed may be placed in a single substrate cleaning tool 500 such as the one illustrated in FIG. 5a. In an embodiment, the substrate may be a wafer substrate 508 that is held about 3 mm above the surface of plate 502 during cleaning. In an embodiment of the present invention, the wafer substrate 508 is clamped face up to wafer support 509 by a plurality of clamps 510. Alternatively, as illustrated in FIG. 5a, the wafer substrate 508 may be supported on elastomeric pads on posts and held in place by gravity.

Figure 5B:
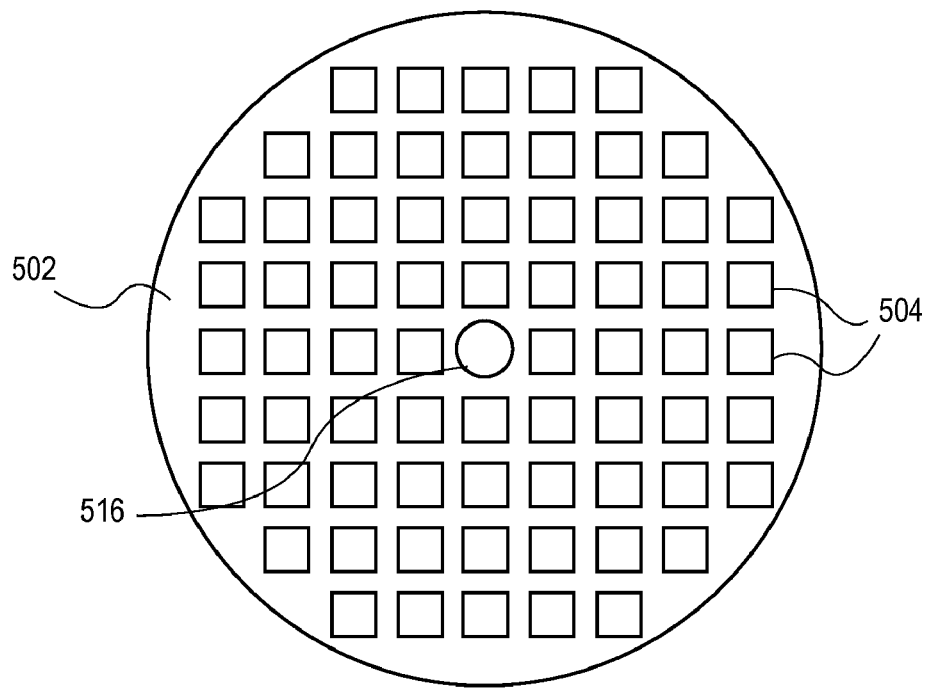
FIG. 5b is an overhead view of an acoustic energy plate having transducers.
Figure 5C:
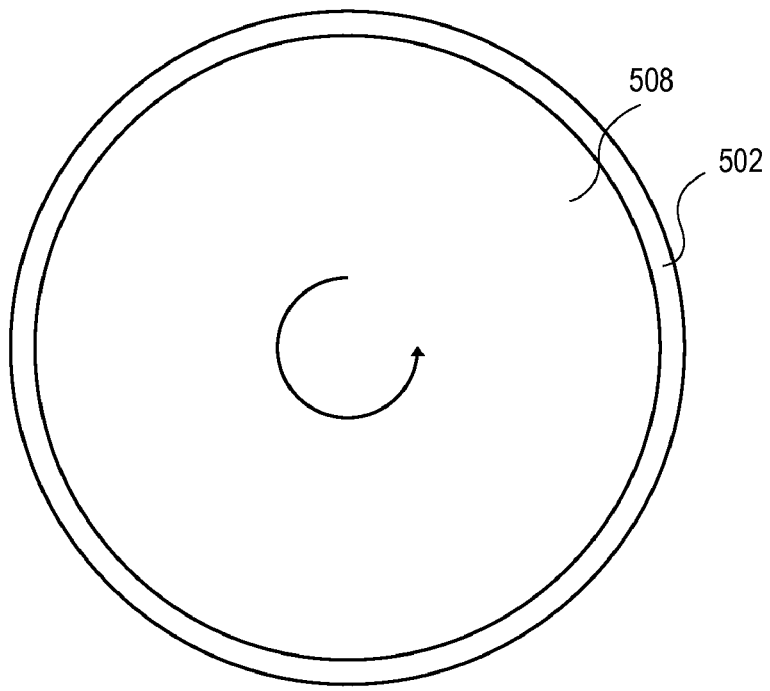
FIG. 5c is an overhead view of a wafer positioned over an acoustic energy plate.

At block 410 of FIG. 4, the wafer substrate 508 is spun after it is placed in the single wafer cleaning tool 500. The wafer support 509 may horizontally rotate or spin wafer 508 about its central axis at a rate of between 0 rpm-6000 rpm, and more particularly in the approximate range of 5 rpm and 2500 rpm. Additionally, in apparatus 500, wafer substrate 508 may be placed face up with the side of the wafer substrate 508 having patterns or features such as transistors facing towards a nozzle 514 for spraying cleaning chemicals thereon and the backside of the wafer substrate 508 faces plate 502. Additionally, as illustrated in FIG. 5c, the transducer covered plate 502 has substantially the same shape as wafer substrate 508 and covers the entire surface areas of wafer substrate 508. Apparatus 500 can include a sealable chamber 501 in which nozzle 514, wafer substrate 508, and plate 502 are located as illustrated in FIG. 5a.

At block 420 of FIG. 4, the cleaning solution including a solvent having a surface tension less than that of water is dispensed onto the wafer 508 from nozzle 514. An amount of the cleaning solution sufficient to effectively clean the surface of the wafer substrate 508 may be dispensed onto the wafer substrate 508, and in an embodiment where a 300 mm wafer substrate 508 is cleaned the amount of cleaning solution dispensed onto the wafer substrate 508 may be in the approximate range of 200 ml and 300 ml. The thickness of the cleaning solution on the wafer substrate 508 may be approximately 1 mm. The nozzle 514 may remain stationary over the center of the wafer substrate 508 or it may be at the end of a movable arm that may sweep across the wafer substrate 508 as it dispenses the cleaning solution. The nozzle may simply dispense a stream of the cleaning solution onto the wafer substrate 508 or it may spray the cleaning solution onto the wafer substrate 508. The solvent having a surface tension less than that of water may be selected based on many criteria. These criteria include a low Van der Waals attraction between the particles and the substrate, a high electrostatic repulsion between the particles and the substrate (such as wafer substrate 508), low viscosity, controllable and low energy cavitation, and controllable dissolved gas levels. Additionally, it would be valuable to have a low surface tension solvent with a high flash point, non-toxic fumes, environmentally safe, and economical to purchase, dispose of, and use in state of the art cleaning tools.

The solvent having a surface tension less than that of water may be acetic acid or an amine-containing solvent. In the embodiment where the solvent is acetic acid the cleaning solution may be 100% acetic acid or it may be a mixture of water and acetic acid. The acetic acid cleaning solution may also be formulated for a single use where the cleaning solution is disposed of after it is dispensed on the wafer substrate 508 and spun off. The cleaning solution may be less than approximately 20% by weight water, and more particularly less than approximately 5% by weight water to clean polysilicon structures. In another embodiment, the acetic acid cleaning solution may be a mixture of acetic acid and another compatible solvent having a surface tension less than that of water. In the embodiment where the solvent is an amine-containing solvent, the cleaning solution may be a pure solvent such as n-methylpyrrolidone (NMP), dimethylsulfoxide (DMSO), and dimethylacetamide (DMAC.) The amine-containing solvent may also be mixed with an amount of water sufficient to provide forceful enough cavitation to effectively clean fragile structures without causing damage to the fragile structures. In another embodiment, the amine-containing solvent may be mixed with another compatible low surface tension solvent. Other low surface tension solvents include, but are not limited to, dimethyl formamide (DMF), dimethyl acetamide (DMAC), sulfolane, butyl lactone, n-methylpurrollidone (NMP), dimethyl sulfoxide (DMSO), dimethylethanolamine (DMAE), glycol ether, acetone, poly-ethylene glycol (PEG), morpholine, ethylene diamine, mono-ethylamine (MEA), diglycolamine (DGA), methyl isopropyl alcohol (MIPA), isopropyl alcohol (IPA), tetramethyl ammonium hydroxide (TMAH), tetraethyl amine (TETA), and hydroxylamine.

In an embodiment, a surfactant or combination of surfactants may be added to the low surface tension cleaning solution. The addition of a surfactant may further lower the surface tension of the cleaning solution and may also aid in wetting the surface of the substrate to be cleaned and prevent cleaning solution from sticking in the submicron features of the surface of the wafer. The surfactant may be non-ionic or anionic. For example, the surfactant may be polyoxyethylene butylphenyl ether or polyoxyethylene alkylphenyl sulfate. The amount of surfactant in the cleaning solution may be in the approximate range of 10 ppm and 100 ppm.

The low surface tension cleaning solution may also contain a cavitation gas, or mixture of cavitation gases, such as $H_2$, $N_2$, He, Ar, $O_3$, and $O_2$. The solvent used in the low surface tension cleaning solution may be selected based on the ability to control the amount of cavitation gas that can be dissolved into the solvent and also on the solubility of cavitation gas into the solvent. In an embodiment, the cavitation gas may be dissolved into the cleaning solution in-line while the cleaning solution is fed through conduit 526. The cavitation gas may be dissolved into the cleaning solution by a venturi apparatus 528 that is a narrowing of the conduit 526. The venturi 528 enables a gas to be dissolved into the cleaning solution at a pressure less than the pressure of liquid flowing through conduit 526. A dissolved cavitation gas may accelerate the cleaning of the STI trenches and other structures formed on the wafer in combination with acoustic energy applied to the wafer substrate 508 during a cleaning.

After, or during, applying the cleaning solution to the wafer substrate 508, the acoustic energy plate 502 is raised to be within approximately 3 mm of the wafer substrate 508. A liquid is then flowed through the conduit 516 to fill the gap 518 between the acoustic energy plate 502 and the wafer substrate 508. The single wafer cleaning apparatus 500 illustrated in FIG. 5a includes an acoustic energy plate 502 with a plurality of acoustic or sonic transducers located thereon. Acoustic energy plate 502 is preferably made of aluminum but can be formed of other materials such as but not limited to stainless steel and sapphire. The plate is preferably coated with a corrosion resistant fluoropolymer such as Halar or PFA. The transducers 504 are attached to the bottom surface of plate 502 by an epoxy 506. In an embodiment, the transducers 504 cover substantially the entire bottom surface of acoustic energy plate 502 as illustrated in FIG. 5b, and may cover at least 80% of plate 502. In an embodiment, the transducers 504 are piezoelectric devices. The transducers 504 create acoustic or sonic waves in a direction perpendicular to the surface of the wafer 508. A wafer substrate 508 is horizontally held by a wafer support 509 parallel to and spaced-apart from the top surface of plate 502. The transducers 504 may generate acoustic energy waves in the frequency range above 350 kHz. The frequency of the acoustic energy applied to the wafer 508 by the acoustic energy plate may be approximately 1 MHz. But there may be circumstances where other frequencies may be ideal for particle removal. The force created by cavitation may be modulated by changing the power of the acoustic energy to be within the approximate range of 10 W and 1000 W. The power of the acoustic energy may be altered by altering the voltage applied to the transducers 504.

Therefore, the cleaning solution containing a solvent having a surface tension lower than that of water in combination with acoustic energy may be used to clean the wafer substrate 508 at block 450 of FIG. 4. After cleaning the surface of the wafer substrate 508, the cleaning solution is spun off of the wafer at block 460 at a spin rate in the approximate range of 50 rpm and 200 rpm. The surface of the wafer is then rinsed with a distilled water rinse at block 470. Then, at block 480 the wafer is dried by a spin dry by spinning the wafer at a spin rate in the approximate range of 800 rpm and 1500 rpm. The spin dry may be in combination with a solvent such as isopropyl alcohol (IPA) applied to the surface of the wafer.

Figure 2A:
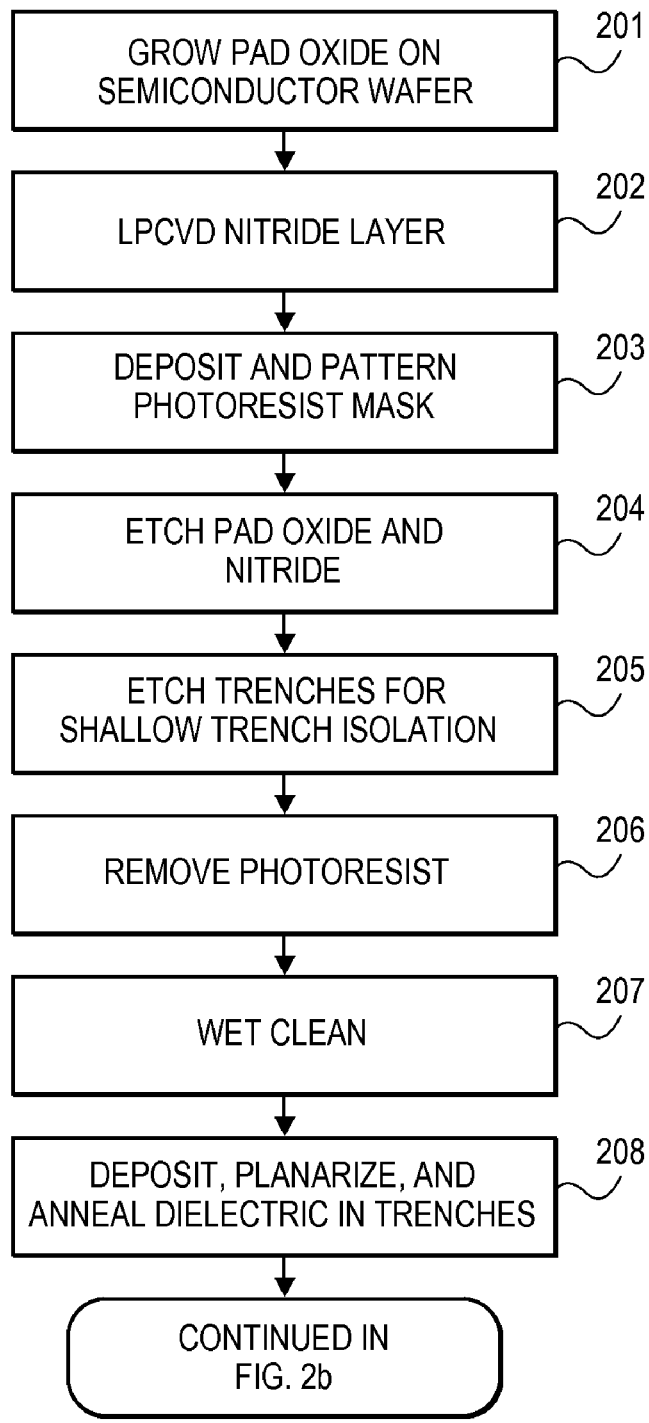
FIGS. 2a-2d are a flow chart of a front-end-of-the-line process utilizing cleaning solutions and methods of the present invention.
Figure 3A:
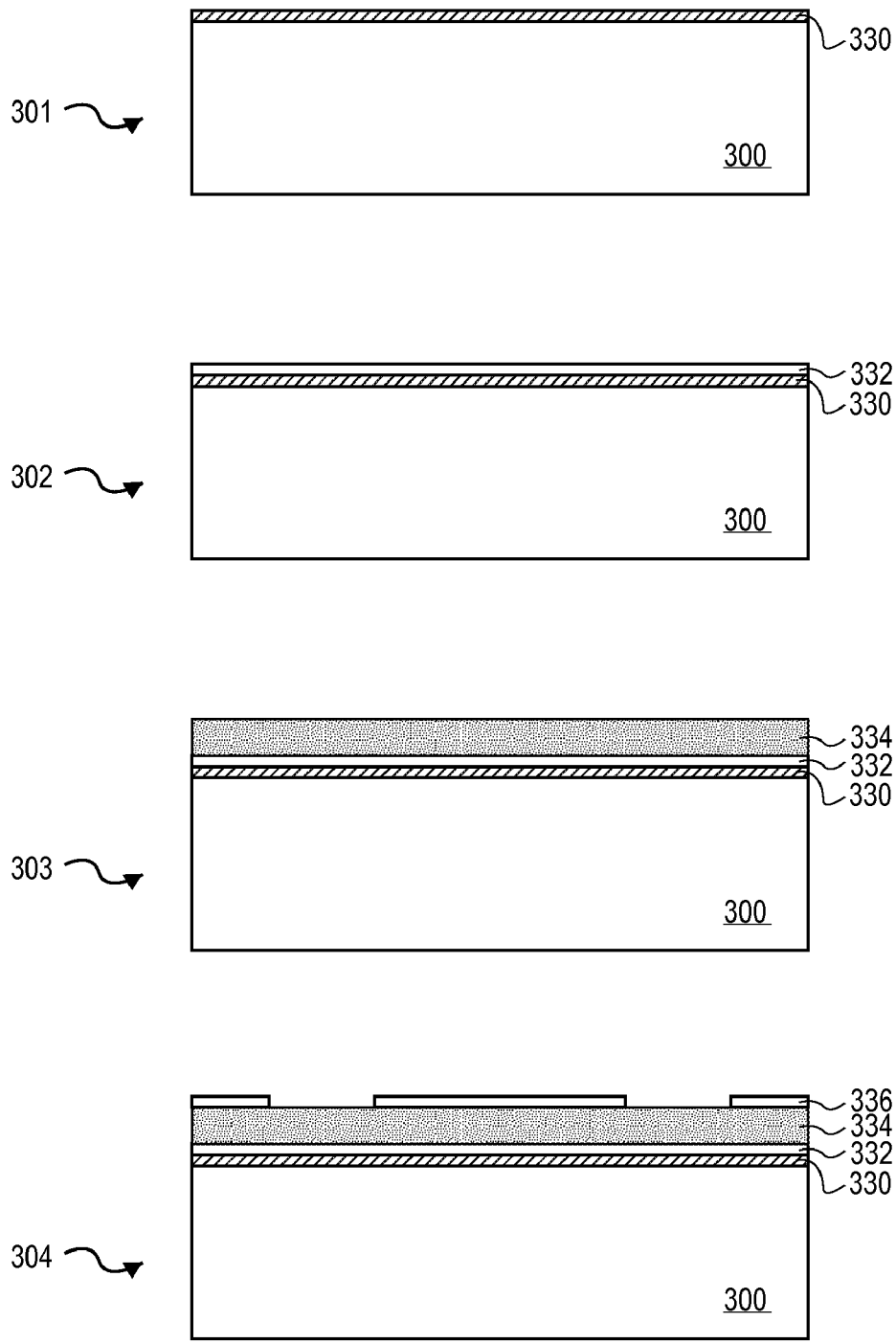
FIGS. 3a-3g are cross-sectional views of a substrate throughout a front-end-of-the-line process utilizing cleaning solutions and methods of the present invention.
Figure 3B:
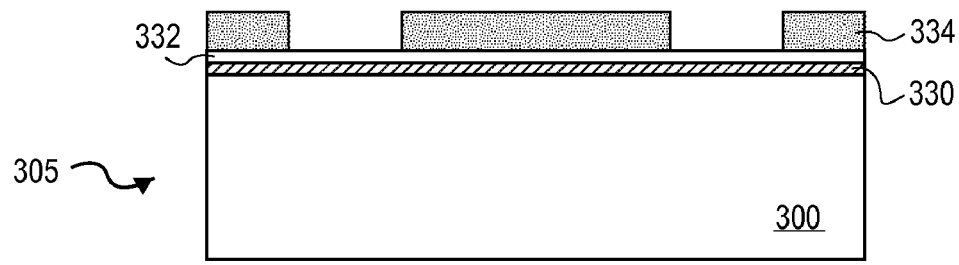
Figure 3B:
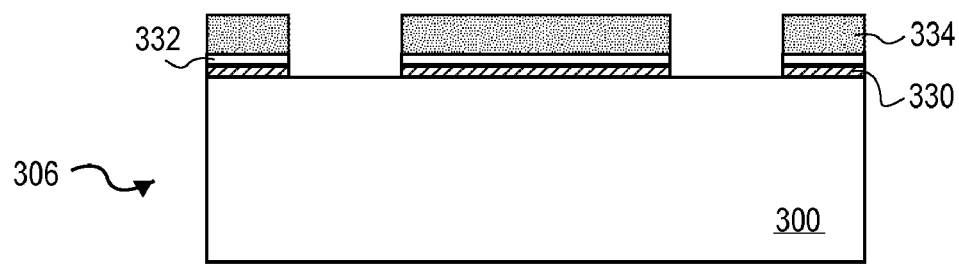
Figure 3B:
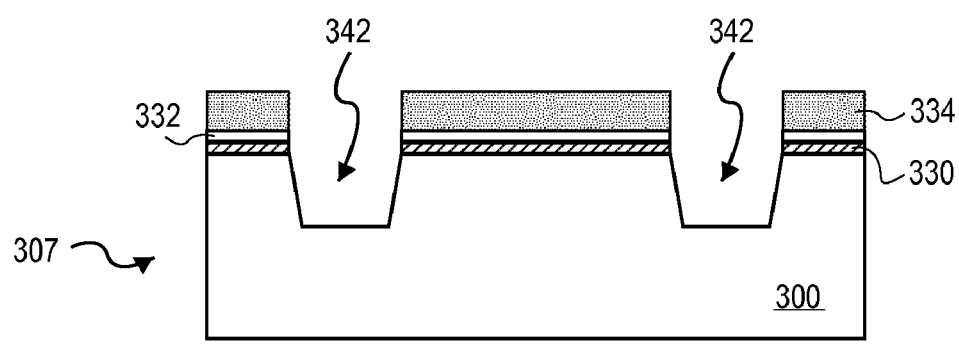
Figure 3B:
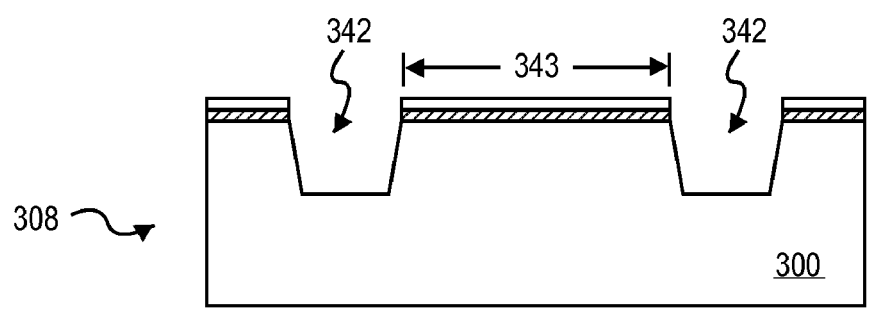
Figure 3C:
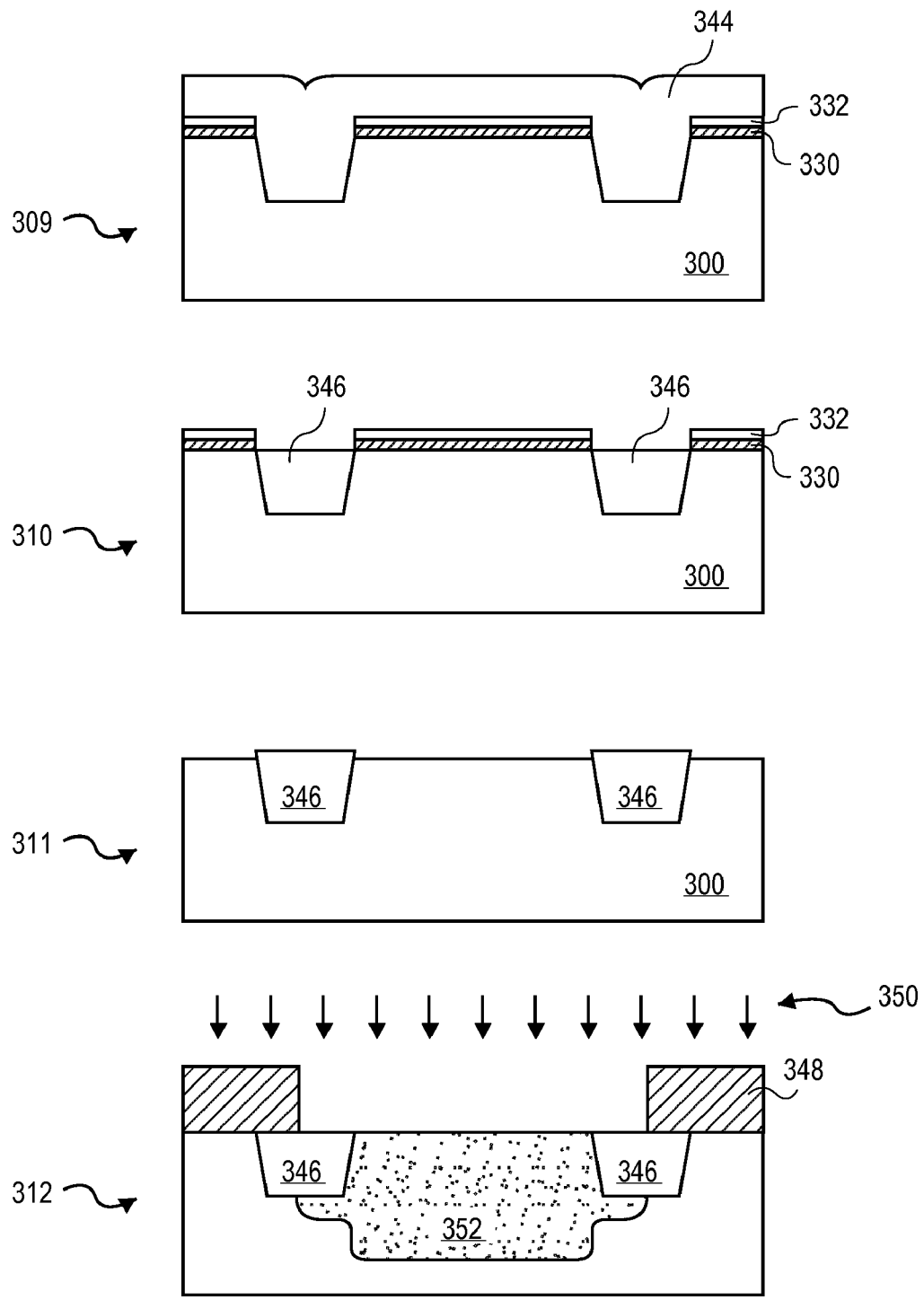
Figure 3D:
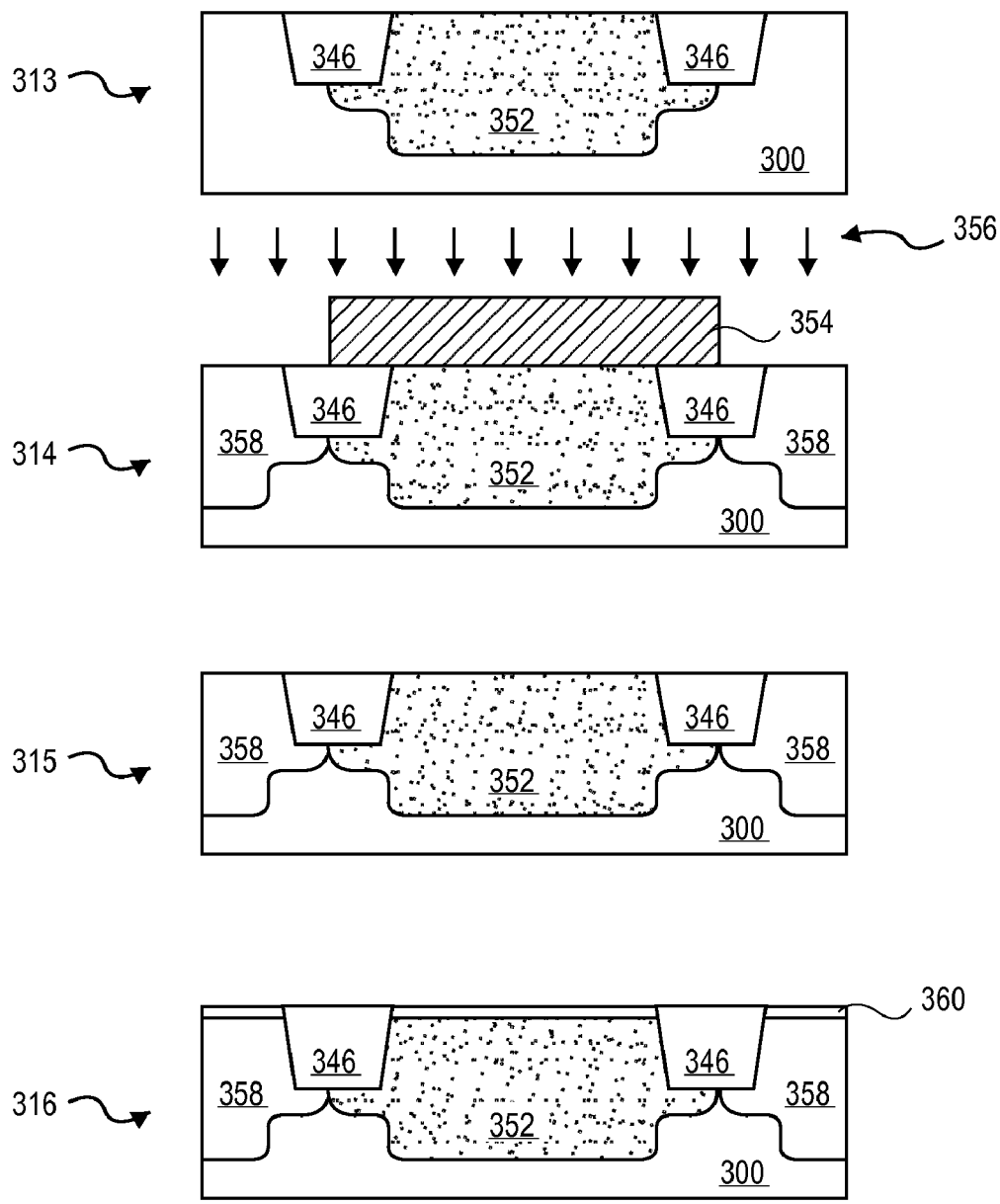
Figure 3E:
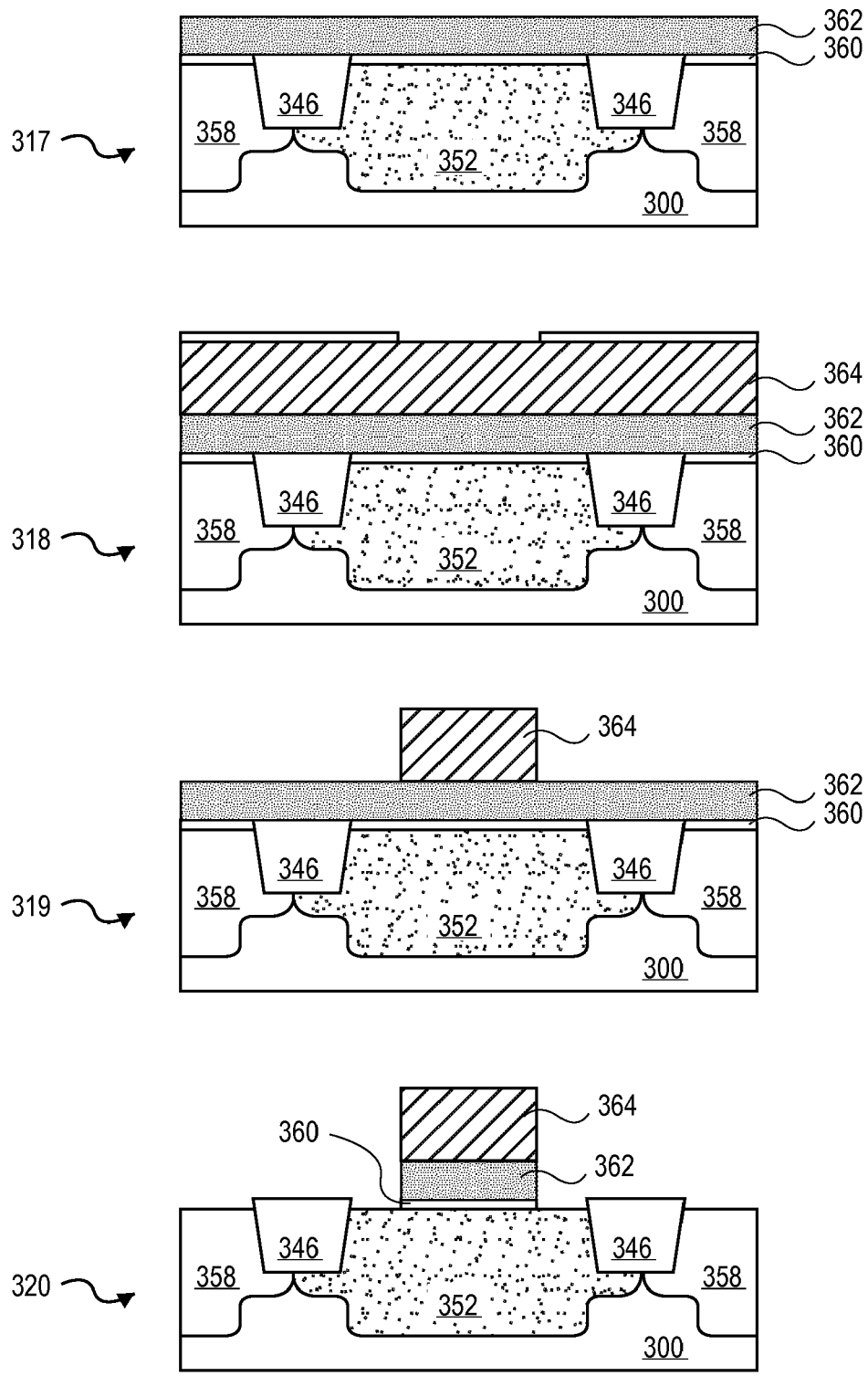

After cleaning the STI trenches 342 illustrated at 308 of FIG. 3b, at block 208 of FIG. 2a, a dielectric layer 344 is deposited into the STI trenches 342, planarized, and annealed. The STI trenches 342 are filled with silicon dioxide 344 by chemical vapor deposition as illustrated in FIG. 3c at 309. The silicon dioxide 344 is then planarized by chemical mechanical polishing to remove excess silicon dioxide from the surface of the substrate 300 and leave the oxide filled STI structures 346 as illustrated at 311. The chemical mechanical polishing will not polish the nitride layer 332 and the oxide layer 330. An anneal is then performed to densify the silicon dioxide within the STI trenches 346. At block 209, the nitride layer 332 and the oxide layer 330 are stripped as illustrated at 311 in FIG. 3c. Implants of p or n dopants are then performed at block 210 for n-well and p-well implants. In FIG. 3c at 312, a mask 348 is formed and patterned to expose particular portions of the substrate 300 to the n-dopants 350 that are implanted to form n-well 352. At 313 the mask 348 is removed and at 314 mask 354 is formed and patterned to expose particular portions of the substrate 300 to the p-dopants 356 that are implanted to form p-wells 358. The mask 354 is then removed at 315. At block 211 a gate dielectric is formed. The gate dielectric is formed in this embodiment by depositing a silicon dioxide (oxide) layer 360 over the surface of the substrate at 316. The gate dielectric may also be formed of silicon nitride or other high dielectric constant materials such as halfnium oxide. Next, at block 212 a polysilicon layer 362 is deposited over the oxide layer 360 as illustrated at 317. At block 213, a photoresist 364 is then deposited over the polysilicon layer 362, masked at 318, and patterned at 319. At block 214 the polysilicon 362 and oxide 360 are etched to form a gate stack illustrated at 320 in FIG. 3e.

Figure 2B:
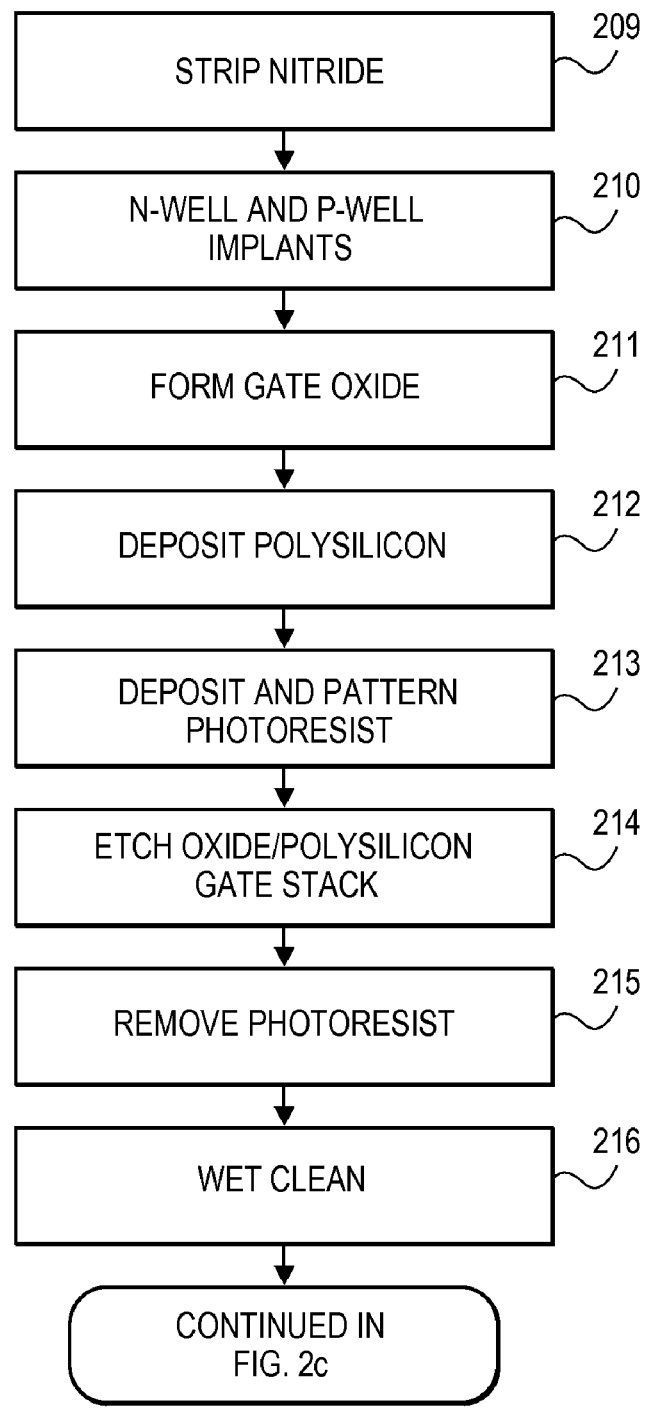
Figure 2C:
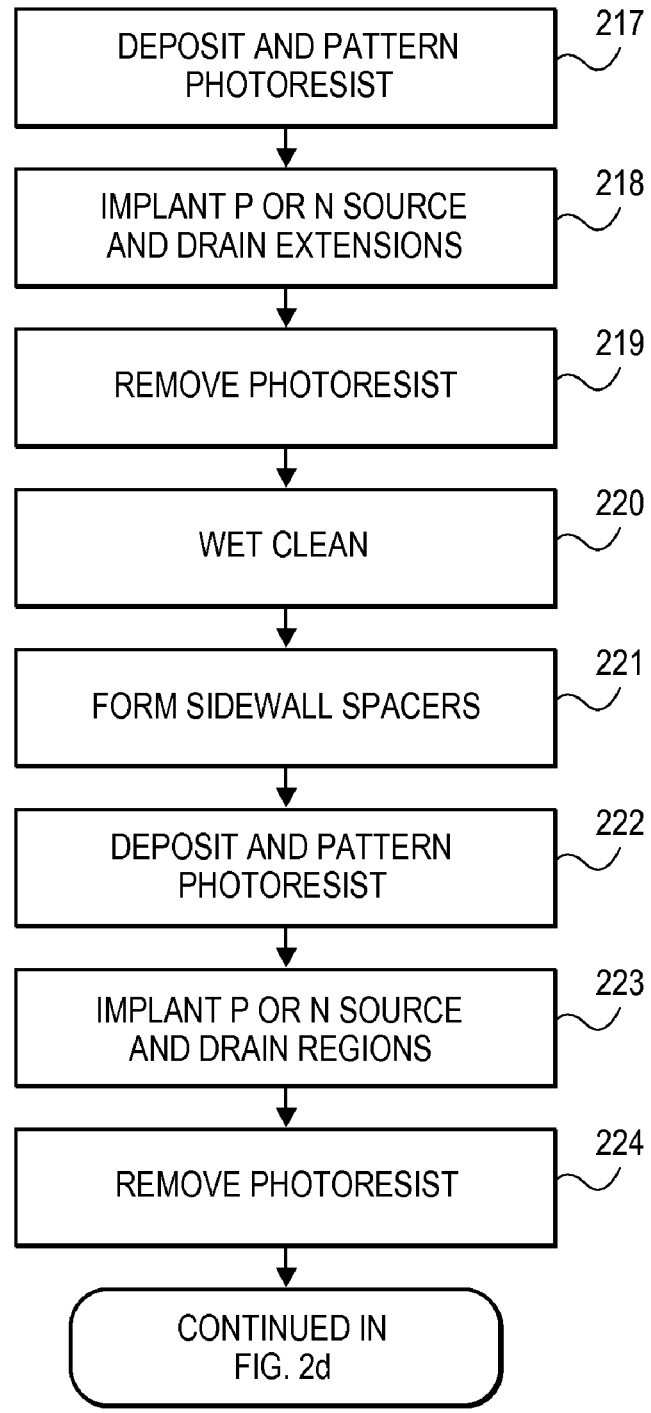
Figure 2D:
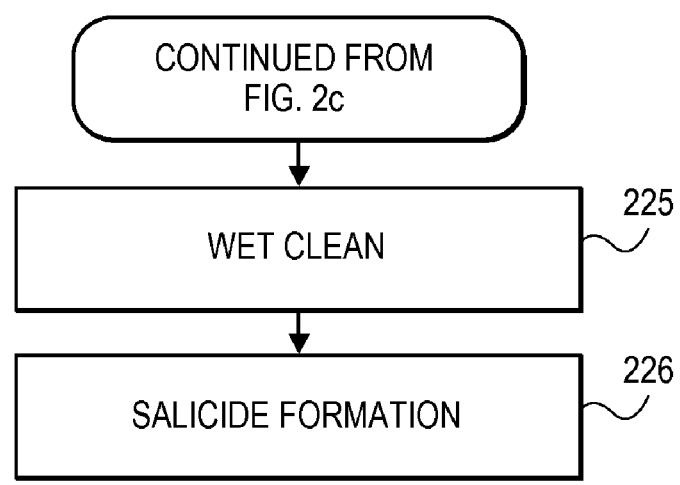
Figure 3F:
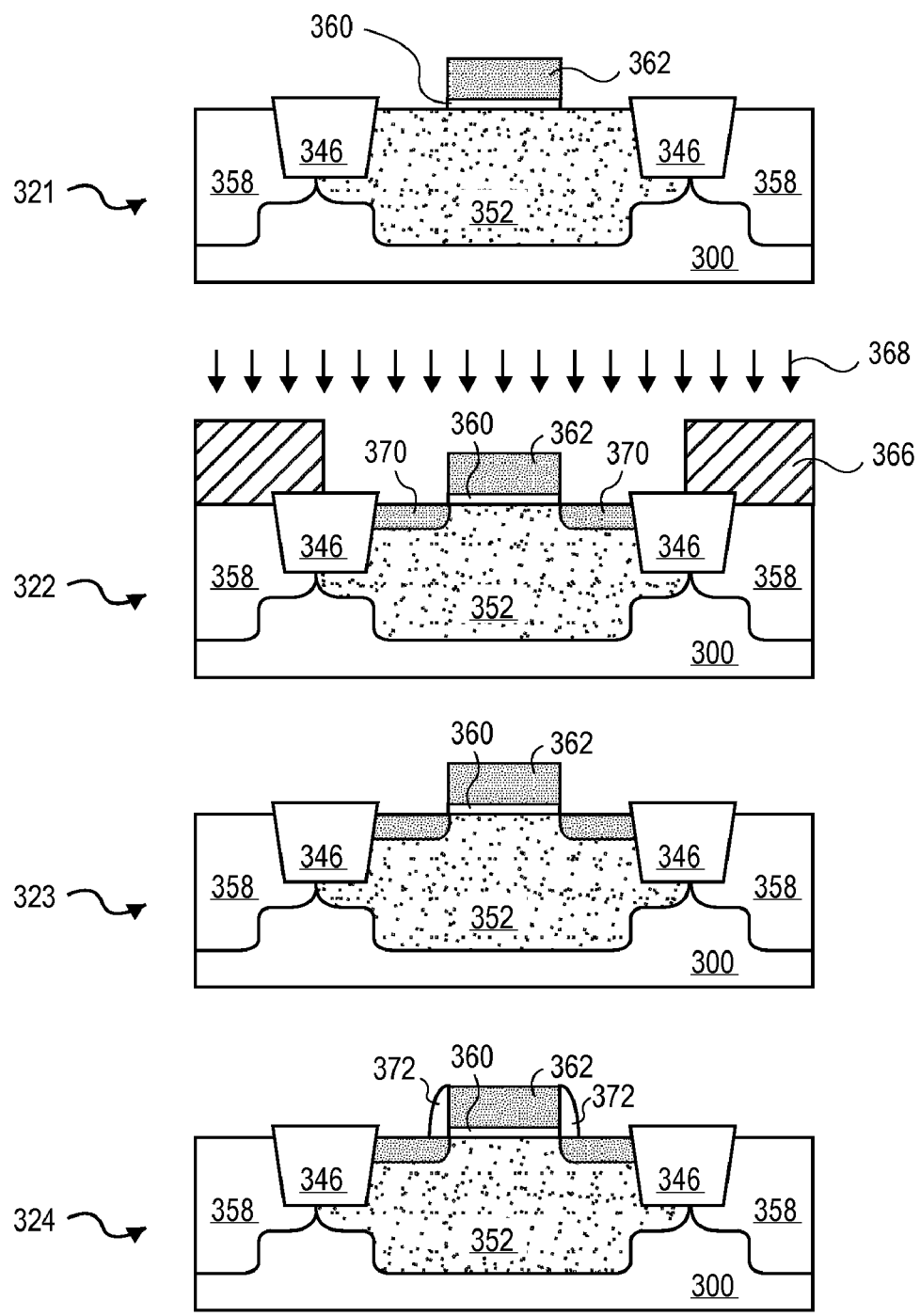
Figure 3G:
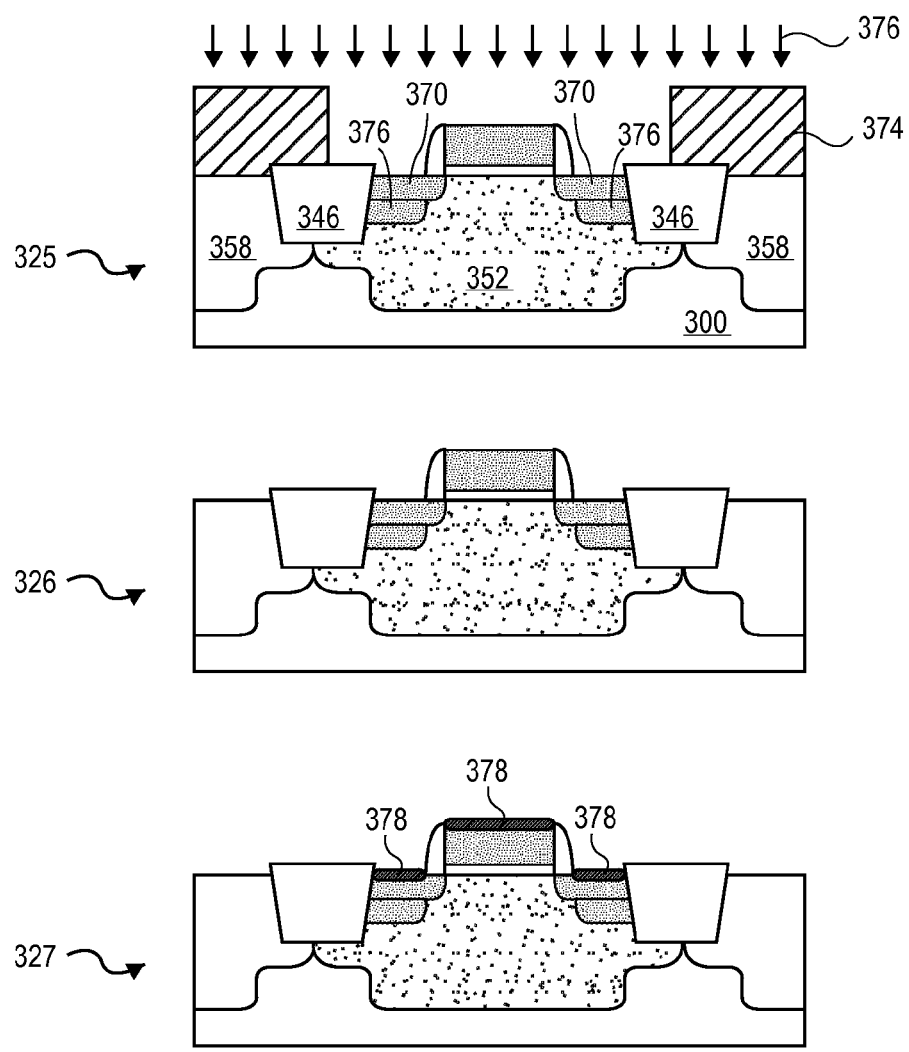

After the photoresist 364 is removed at block 215, a wet clean is performed on the gate stack illustrated at 321 of FIG. 3f at block 216. The gate stack may be fragile because it has a dimension of less than 0.15 μm and due to the polysilicon material. The gate stack may also be more fragile than many structures because the polysilicon 362 is formed on a thin oxide layer 360. Polysilicon structures such as the gate stack are typically the most fragile structures in both FEOL and BEOL processing. Bare polysilicon structures remain fragile until they are covered with another material. The polysilicon gate stack of 321 typically remains bare throughout several cleaning steps. During each of these cleaning steps the polysilicon gate stack may be cleaned with a cleaning solution formed of a solvent having a surface tension lower than that of water and acoustic energy without being damaged. As in the cleaning described above for the STI trenches, the gate stack at 321 may be cleaned with a cleaning solution formed of a solvent having a surface tension lower than that of water, such as acetic acid or an amine-containing solvent, in combination with acoustic energy. After the wet clean at block 216 of FIG. 2b, a photoresist is deposited and patterned at block 217 as illustrated at 322 of FIG. 3f. The substrate 300 is then implanted with p-dopants 368 to form source-drain extension regions 370 at block 218. At block 219, the photoresist is removed by a wet developer or by a plasma ashing with $H_2$ or $O_2$ to leave structure 323. At block 220 the gate stack illustrated at 323 is again cleaned with a cleaning solution formed of a solvent having a surface tension lower than that of water in combination with acoustic energy, as described above. Then, at block 221, sidewall spacers 372 are formed on the sides of the gate stack as illustrated at 324. A photoresist 374 is again formed over the substrate 300 at and patterned at block 222 to implant p-dopants to form the source drain regions 376 at block 223. The photoresist is then removed at block 224 and the structure at 326 of FIG. 3g may be cleaned at block 225 with a cleaning solution formed of a solvent having a surface tension lower than that of water in combination with acoustic energy, as described above. The polysilicon 362 of the gate stack is completely covered at block 226 by a salicide, as illustrated by the transistor at FIG. 327.

In an alternate embodiment, the method of cleaning fragile structures with a cleaning solution formed of a solvent having a surface tension lower than that of water in combination with applying acoustic energy to the wafer in may be used to clean a memory stack in the FEOL for a memory device such as DRAM or SDRAM. The fragile memory stack may have a smallest dimension of less than 0.15 µm. In other embodiments, fragile structures in the BEOL may be cleaned with a cleaning solution having a surface tension lower than that of water and acoustic energy. These fragile structures include polysilicon interconnect lines and dual damascene openings in a low-k dielectric material having a dimension of less than 0.15 µm.

Figure 10:
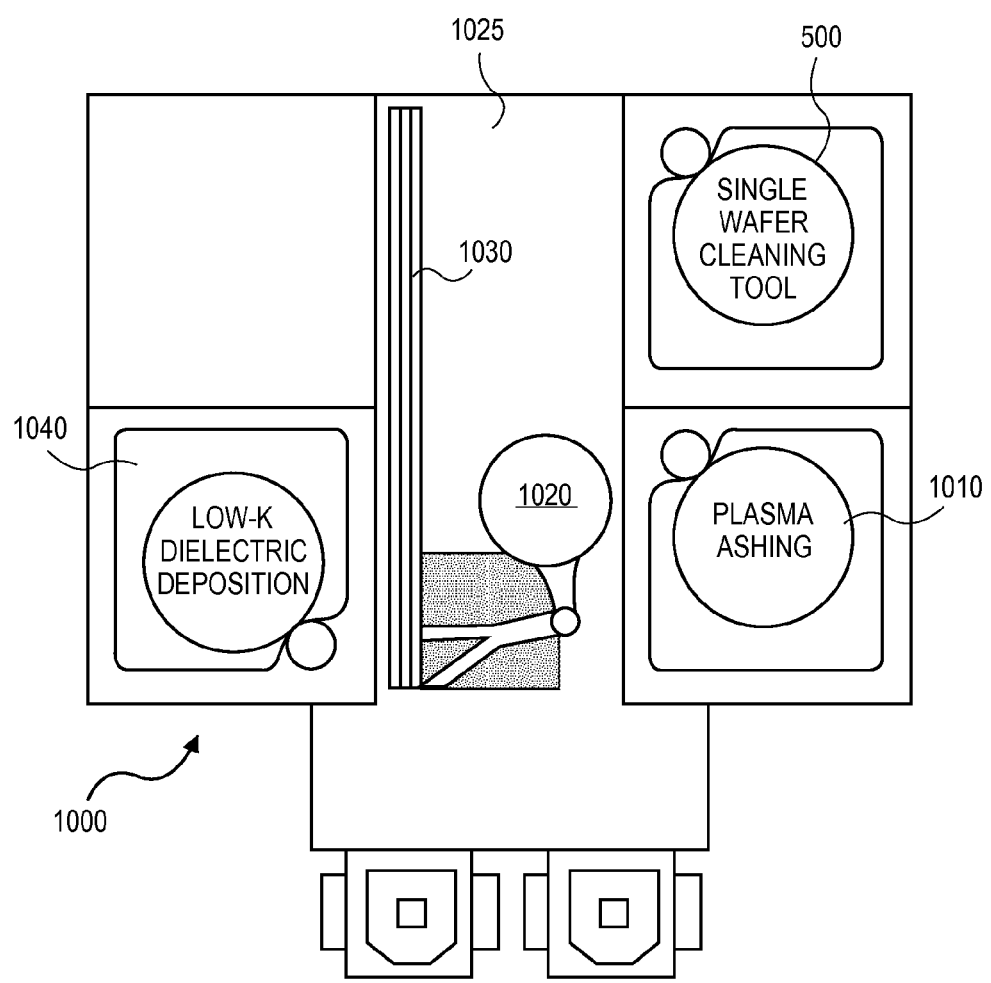
FIG. 10 is an overhead view of a cluster processing tool.

The surface of a substrate after metallization (back-end-of-the-line) may be cleaned with several different cleaning solutions and cleaning methods. The cleaning solutions that may be used include an aqueous cleaning solution formed of an acid that will not oxidize copper, hydrofluoric acid (HF), and water, a cleaning solution formed of a high percentage of acetic acid in combination with acoustic energy, or a cleaning solution formed of tetramethylammonium hydroxide (TMAH) and water. At block 601 of FIG. 6a a substrate having metallization is provided, such as the substrate illustrated at 701 in FIG. 7a. Substrate 701 illustrates a low dielectric constant (low-k) dielectric layer 700, such as carbon doped oxide (CDO), SiOF, a methylsilsesquioxane (MSQ), or an organic polymer, formed above an etch stop layer 730, such as silicon nitride. The low-k dielectric layer 700 may be formed within a low-k dielectric deposition chamber 1040 as illustrated in FIG. 10. The low-k deposition chamber may be, for example, a chemical vapor deposition chamber to deposit a material such as CDO. In an embodiment, the low-k deposition chamber 1040 is connected to a single wafer cleaning tool 500 by a transfer chamber 1025 in which a wafer transfer arm 1020 moves along a track 1030 to transfer a wafer 508 from one chamber to another within the cluster tool 1000. By connecting the low-k deposition chamber 1040 to the single wafer cleaning tool 500 within the cluster tool 1000 the processing time of the wafer may be reduced. Adhesion may be improved when performing the cleaning right before the low-k deposition. The low-k dielectric layer 700 and the etch stop layer 730 are formed above a layer of metallization. A portion of the lower layer of metallization is illustrated as a low-k dielectric layer 732 and a metal interconnect line 734. The metal interconnect line 734 in this particular embodiment is copper, but in alternate embodiments it may be a metal such as aluminum or silver.

At block 602 the backside of the wafer substrate 508 on which the substrate 701 is formed is cleaned with a backside pre-via lithography clean. To clean the backside of the wafer substrate 508, the wafer is placed in a single wafer cleaning tool 500 such as the apparatus illustrated in FIG. 5a. The wafer substrate 508 may be held approximately 3 mm above the surface of plate 502 during cleaning. In an embodiment, as illustrated in FIG. 5a, the wafer substrate 508 may be supported on elastomeric pads on wafer support 510 and held in place by gravity.

The wafer substrate 508 is spun after it is placed in the single wafer cleaning tool 500. The wafer support 510 may horizontally rotate or spin wafer substrate 508 about its central axis at a rate of between 0 rpm-6000 rpm, and more particularly in the approximate range of 5 rpm and 2500 rpm. Additionally, in apparatus 500, wafer substrate 508 may be placed face up with the side of the wafer substrate 508 with patterns or features, such as transistors, faces towards a nozzle 514 for spraying cleaning chemicals thereon and the backside of the wafer substrate 508 faces plate 502. Additionally, as illustrated in FIG. 5c, the transducer covered plate 502 has a substantially same shape as wafer substrate 508 and covers the entire surface areas of wafer substrate 508. Apparatus 500 can include a sealable chamber 501 in which nozzle 514, wafer substrate 508, and plate 502 are located as illustrated in FIG. 5a. The plate 502 is raised after the wafer substrate 508 begins spinning and a cleaning solution to clean the bottom of the wafer substrate 508 is flowed through conduit 516 to fill the space 518 between the wafer substrate 508 and the plate 502. The cleaning solution may be a mixture of ammonium hydroxide ($NH_4OH$), hydrogen peroxide ($H_2O_2$), water, a chelating agent such as EDDHA or EDTA, and a surfactant. This cleaning solution removes residues including copper oxide (CuO) and copper metal and organic based residues, but does not detrimentally etch the silicon based materials on the backside of the wafer substrate 508. After flowing the cleaning solution into the space 518 between the wafer substrate 508 and the plate 502, acoustic energy may be applied to the wafer substrate 508 by the plate 502 to enhance the cleaning of the backside of the wafer substrate 508. The acoustic energy may be approximately 1 MHz. The cleaning solution and the acoustic energy may be applied to the wafer substrate 508 for approximately 30 seconds. After cleaning the backside of the wafer substrate 508 with the cleaning solution, the backside of the wafer substrate 508 is rinsed with deionized (DI) water. Acoustic energy may or may not be applied to the wafer substrate 508 during the rinsing step. If acoustic energy is applied during the rinse, the DI water may be degassed so that cavitation is reduced in the DI water filled gap 518 where the acoustic waves are strongest to reduce potential damage to the wafer substrate 508. The wafer substrate 508 is then dried with a spin-dry at a spin rate in the approximate range of 800 rpm and 1500 rpm for approximately 30 seconds.

Figure 6A:
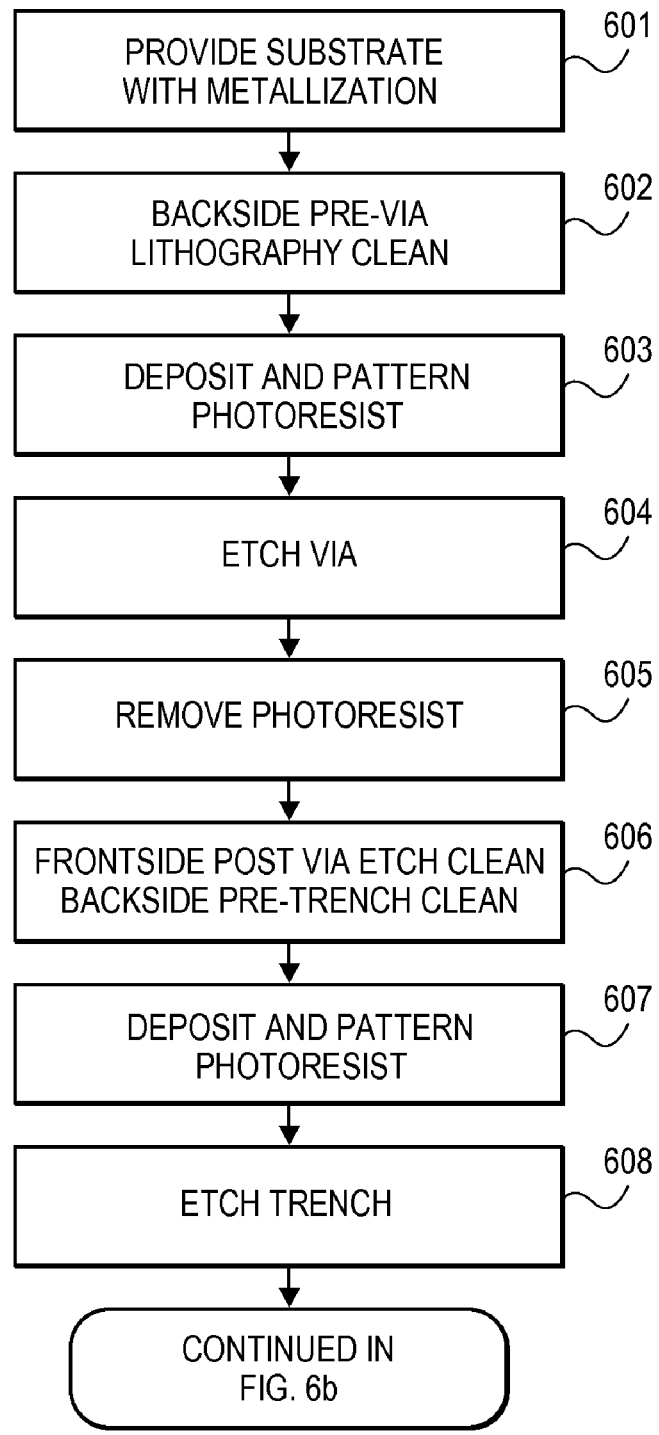
FIGS. 6a-6c are a flow chart of a back-end-of-the-line process utilizing cleaning solutions and methods of the present invention.
Figure 6B:
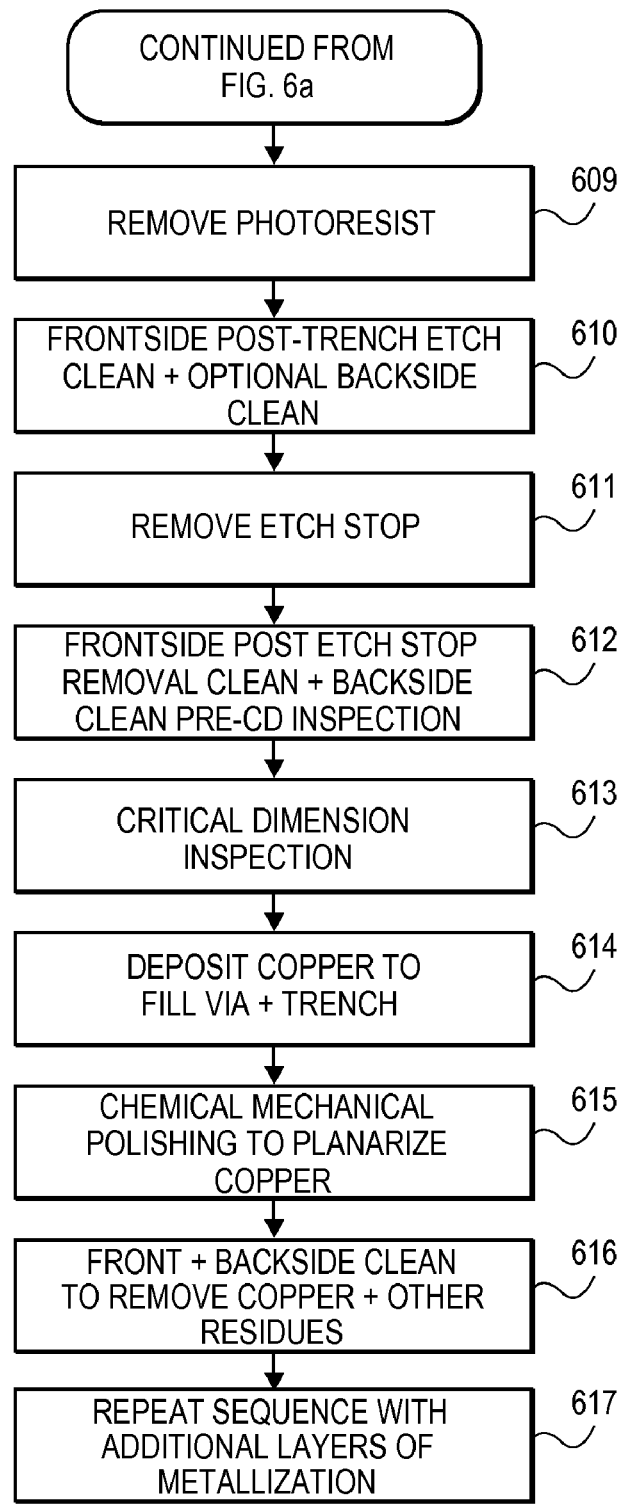
Figure 7A:
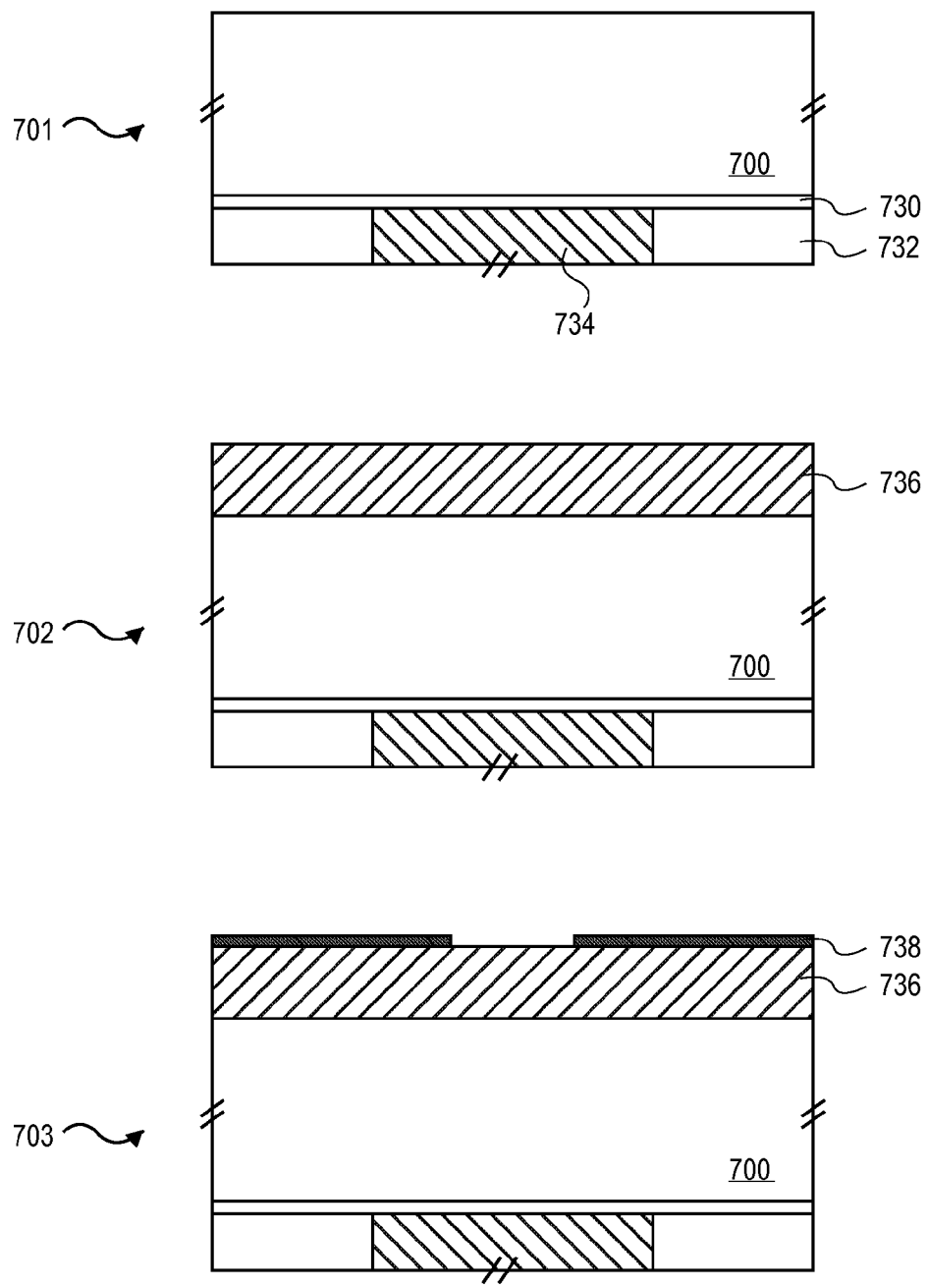
FIGS. 7a-7i are cross-sectional views of a substrate throughout a back-end-of-the-line process utilizing cleaning solutions and methods of the present invention
Figure 7B:
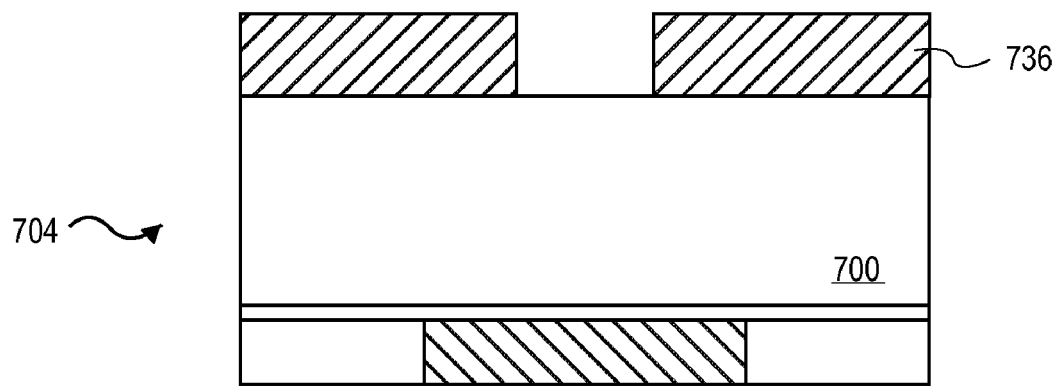
Figure 7B:
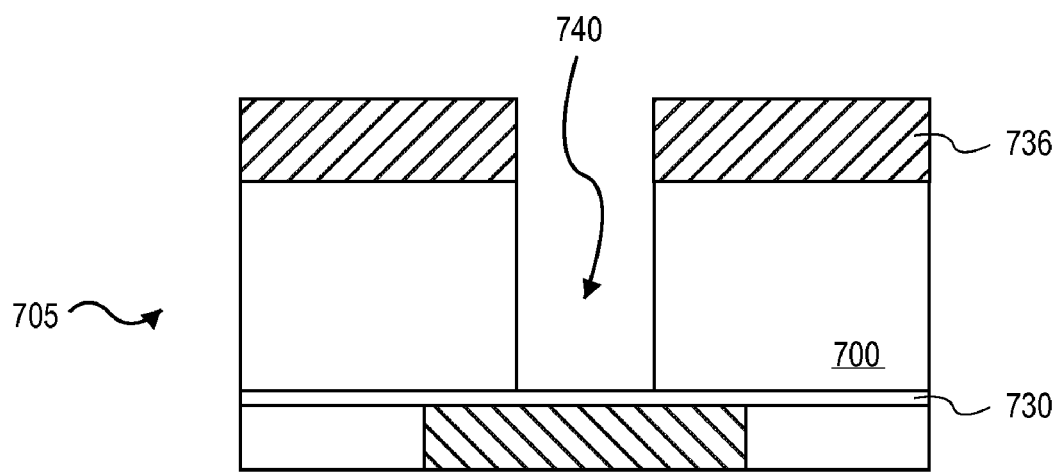
Figure 7B:
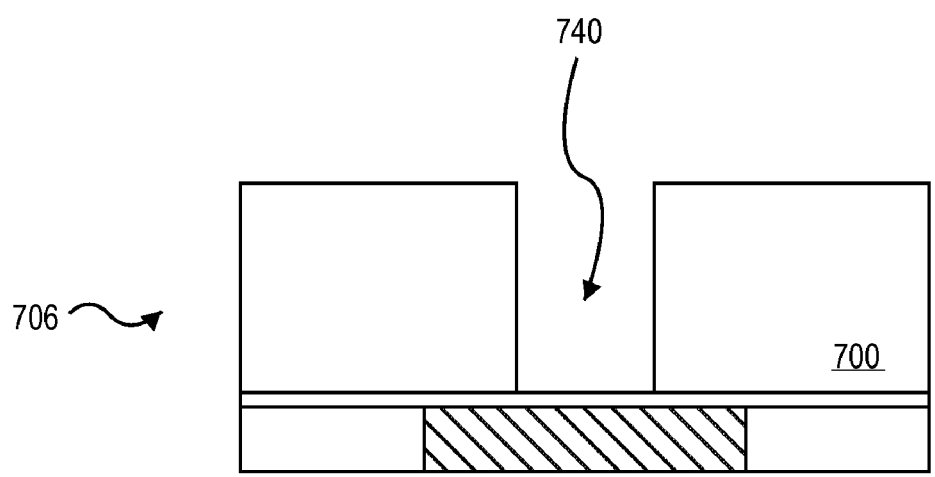

At block 603 of FIG. 6a a photoresist 736 is deposited and patterned above the low-k dielectric layer 700 in FIG. 7a at 702, 703, and 704. At 702 the photoresist 736 is deposited by spin coating over the low-k dielectric 700. A mask 738 is then formed above the photoresist 736 at 703, and the photoresist 736 is patterned at 704 in FIG. 7b. The low-k dielectric 700 is etched at block 604 to form a via 740 as illustrated at 705. The low-k dielectric may be etched by a medium density magnetically enhanced reactive ion etching system ("MERIE" system) using fluorocarbon chemistry when a silicon dioxide based dielectric layer 700 is used, such as CDO or by a forming gas chemistry, e.g., one including nitrogen and either hydrogen or oxygen when a polymer-based low-k dielectric 700 is used. The photoresist 736 is removed at block 605 by a wet chemistry or by an $H_2$ or $O_2$ plasma ashing. The plasma ashing may be performed in a plasma ashing chamber 1010 that is connected to a single substrate cleaning tool 500 by a transfer chamber 1025 within a cluster tool 1000 as illustrated in FIG. 10. The wafer substrate 508 is transferred from the single substrate cleaning tool 500 by a substrate transfer arm 1020 that moves along track 1030 within the transfer chamber 1025 to the plasma ashing chamber 1010. It may be valuable to connect the ashing chamber and the cleaning tool within the cluster tool because residues from the ashing become more difficult to remove the longer that they are on the surface of the wafer substrate 508. The plasma ashing of the photoresist 736 removes most of the bulk photoresist 736 and leaves behind a small amount of photoresist residues that may be removed with an aqueous cleaning solution.

The surface at 706 is then cleaned at block 606 with a frontside post via etch clean and a backside pre-trench clean. An exemplary cleaning process is outlined in the flowchart of FIG. 8. To clean the surface, at block 801 the wafer substrate 508 on which the surface is formed may be placed in a single substrate cleaning tool 500 such as the one illustrated in FIG. 5a after being transferred from the plasma ashing chamber 1010 by a wafer transfer arm 1020 through a transfer chamber 1025. The wafer substrate 508 is placed with the etched portions facing upwards onto elastomeric pads on posts 510 and held in place by gravity. Alternately, clamps may be used instead of posts 510, but only on a wafer substrate 508 that does not have delicate materials and structures on the topside of the wafer substrate 508. To clean the topside of the wafer substrate 508, on which the metallized surface is formed and the vias have been etched into the low-k dielectric, several cleaning solutions may be used. Both the top surface of the wafer substrate 508 and the bottom surface of the wafer substrate 508 may be cleaned once the wafer substrate 508 is in position within the single substrate cleaning tool 500. The top surface of the wafer substrate 508 may be cleaned with a different cleaning solution than the bottom surface of the wafer substrate 508. The top surface and the bottom surface may be cleaned with different cleaning solutions simultaneously or staggered but where both surfaces are being cleaned at the same time for some period. This may be accomplished by utilizing cleaning solutions that are formulated for a single use so that once the two cleaning solutions become mixed they may be disposed of.

In one embodiment, an aqueous solution formed of an acid that will not oxidize copper and HF may be used to clean the top surface of the wafer substrate 508, and thus the substrate 706. The acidic aqueous solution has a pH within the approximate range of −1-4. Within this pH range the cleaning solution may dissolve copper oxide (CuO) but not dissolve or etch pure copper metal ($Cu^{(0)}$). Acids that will not oxidize copper include, for example, sulfuric acid, oxalic acid, citric acid, hydrogen chloride, dichloroacetic acid, trichloroacetic acid, and acetic acid. The acidic aqueous cleaning solution for the BEOL may be formulated for a single use. For a single use cleaning solution it is valuable to use an acid that may be easily obtained in high concentrations so that small volumes of the acid may be used to form the dilute aqueous solution while also providing a low pH within the range of −1 and 4. In one particular embodiment, the acid may be sulfuric acid that may be easily obtained in high concentrations in a liquid form. Sulfuric acid may be obtained at approximately 98% by weight in liquid form, requiring only small volumes of the acid to form a dilute acidic cleaning solution. Additionally, sulfuric acid has a very low pH, even when it is diluted. Sulfuric acid may also be valuable because sulfate ($SO_4^{2-}$) is a relatively nonreactive with copper and low-k dielectric materials. In one embodiment, sulfuric acid may be pre-diluted with water to release a majority of the heat created by diluting sulfuric acid before adding the sulfuric acid to the cleaning solution. In such an embodiment, the sulfuric acid may be diluted with water to approximately 70% by weight sulfuric acid in water to release the majority of heat during pre-dilution so that when the 70% by weight sulfuric acid is mixed with the aqueous cleaning solution minimal heat may be released and the temperature of the cleaning solution is approximately room temperature. The amount of sulfuric acid in the cleaning solution may be in the approximate range of 0.5% and 10% by weight and more particularly approximately 5% by weight.

The cleaning solution containing an acid that will not oxidize copper also includes hydrofluoric acid (HF) and enhancers such as a chelating agent and a surfactant. When formulated for a single use, the cleaning solution may have approximately 0.01%-10% by weight of concentrated chemicals including the acid that will not etch copper, HF, and enhancers, and more particularly approximately 1% to 10% by weight. The enhancers may be a chelating agent and a surfactant. The HF in the solution helps remove residues and particles that are deposited on the surface of the low-k dielectric 700, both inside and outside of the via 740, by very slightly etching the surface of the low-k dielectric 700. By combining the acid that will not oxidize copper with HF the cleaning of the surface may be significantly improved by the role of HF in removing residues and particles from the surface. This is because the acids such as sulfuric acid and oxalic acid may not etch the surface of the low-k dielectric. The HF may etch the low-k dielectric 700 less than approximately 50 angstroms and more particularly less than 25 angstroms. The amount of HF in the cleaning solution may be in the approximate range of 150 ppm and 3000 ppm, and more particularly approximately 150 ppm.

The acidic aqueous cleaning solution may further include a chelating agent. The chelating agent may be any chelate that binds to metals such as copper, aluminum, tantalum, titanium, and tungsten. The chelating agent may prevent the redeposition of metal ions, such as $Cu^{2+}$, onto the low-k dielectric 700. Examples of chelating agents that may be used include, for example, ethylenediaminetetraacetic acid (EDTA), and ethylenediamine diorthohydroxyphenylacetic acid (EDDHA). The amount of chelating agent in the cleaning solution may be in the approximate range of 10 ppm and 1000 ppm, and more particularly 100 ppm.

The acidic aqueous cleaning solution may also include a surfactant. The amount of surfactant in the cleaning solution may be in the approximate range of 10 ppm and 1000 ppm, and more particularly 100 ppm. The surfactant may be a nonionic surfactant such as polyoxyethylene butylphenyl ether or a mixture of nonionic surfactants. In one particular embodiment the mixture of nonionic surfactants is the combination of a polyoxyethylene ether and an ethoxylated alcohol. A surfactant may be added to the cleaning solution to aid in the wetting of the surface of the low-k dielectric 700, to reduce the surface tension of the cleaning solution, and to prevent the redeposition of residues onto the surface of the low-k dielectric 700. The mixture of a polyoxyethylene ether and an ethoxylated alcohol is particularly valuable for preventing the redeposition of residues that contain carbon, such as photoresist residues and low-k dielectric residues. Additionally, the mixture of a polyoxyethylene ether and an ethoxylated alcohol is capable of wetting hydrophobic low-k dielectric surfaces by making the surface hydrophilic so that the aqueous cleaning solution spreads out better onto the surface and within the small and deep openings in the dielectric. The smallest and deepest openings in the dielectric may typically be via openings having a width of approximately 0.13 um or 0.09 um. The lower surface tension of the cleaning solution also aids in the penetration of the cleaning solution into the small openings of the dielectric. The surfactant mixture may be particularly valuable in cleaning dual damascene openings in a low-k dielectric. The residues from an acidic aqueous cleaning solution having a low pH may redeposit onto a low-k dielectric surface because the residues and the surface tend to have a different charge and therefore attract one another. The surfactant mixture of a polyoxyethylene ether and an ethoxylated alcohol changes the charge of the residues to be the same as the surface so that the residues are repelled by the surface and are unlikely to redeposit. In an alternate embodiment, a surface conditioning solution formed of the combination of a polyoxyethylene ether and an ethoxylated alcohol in water may be applied to a surface of a substrate, and in particular a low-k surface of a substrate, as a pre-treatment before the substrate is cleaned to wet the surface and any residues present on the surface. In yet another embodiment, the surface conditioning solution formed of the combination of a polyoxyethylene ether and an ethoxylated alcohol in water may be applied to the substrate as a post-treatment after cleaning to prevent redeposition of residues.

In one particular embodiment, the cleaning solution is formed of deoxygenated water, sulfuric acid, HF, the chelating agent EDDHA, and the combination of a polyoxyethylene ether surfactant and an ethoxylated alcohol surfactant. The pH of this cleaning solution may be approximately 0. This cleaning solution is formulated for a single use and is mixed at the point of use. In this embodiment, the amount of concentrated chemicals dissolved into deoxygenated water is approximately 10%. The concentrated chemicals are a mixture of sulfuric acid, HF, EDDHA, and the combination of surfactants. The sulfuric acid that is mixed into the cleaning solution has been prediluted to approximately 70% by weight and brought to room temperature before being diluted in the cleaning solution. The amount of sulfuric acid in the cleaning solution is approximately 5% by weight, the amount of HF is in the approximate range of 150 ppm and 3000 ppm and more particularly approximately 150 ppm, the amount of EDDHA is approximately 100 ppm and the amount of the combination of the polyoxyethylene ether surfactant and the ethoxylated alcohol surfactant is approximately 100 ppm.

Figure 9A:
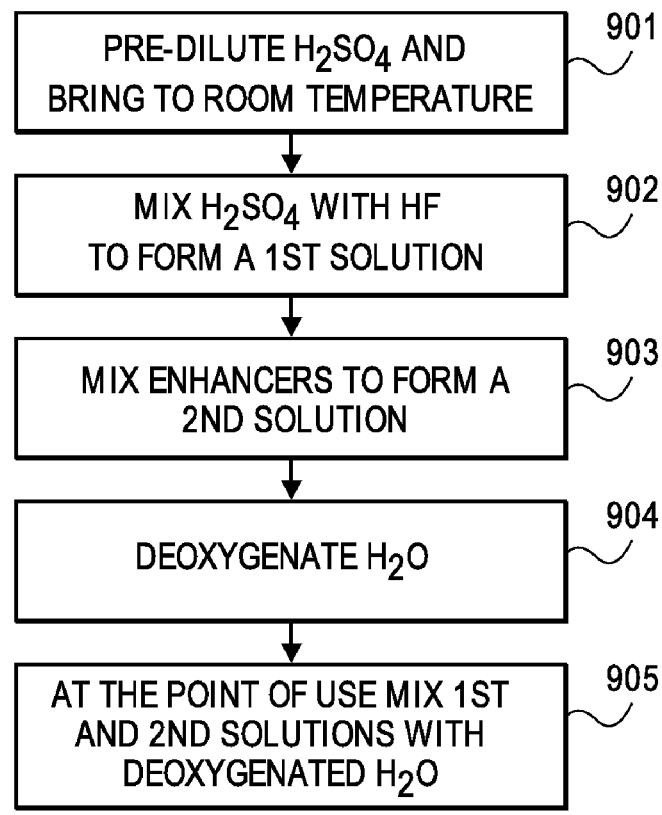
FIGS. 9a-9b are flow charts of point of use mixing embodiments.

At block 802 the aqueous cleaning solution formed of an acid that will not oxidize copper, HF and enhancers may be mixed at a point of use. A first embodiment of the point of use mixing is illustrated in the flowchart of FIG. 9a. In the embodiment, the acid that will not oxidize copper, such as $H_2SO_4$, is mixed with HF to form a first solution at block 902. If the acid that will not oxidize copper is sulfuric acid, the sulfuric acid may be pre-diluted with water prior to the point of use mixing at block 901. By using sulfuric acid that has been diluted to approximately 70% by weight or less sulfuric acid in water, the temperature of the cleaning solution at the point of use may be approximately room temperature when mixed because most of the heat created by the dilution of sulfuric acid in water would have been expended in the pre-dilution. At block 903 the enhancers, such as the surfactant and the chelating agent, are mixed to form a second solution. These two different solutions may each be contained within one of the tanks 524 of the single wafer cleaning tool 500. Another one of the tanks contains deionized water that may be deoxygenated at block 904. Before the surface of the wafer is cleaned, the first solution and the second solution are mixed with water to form the cleaning solution at block 905.

Figure 9B:
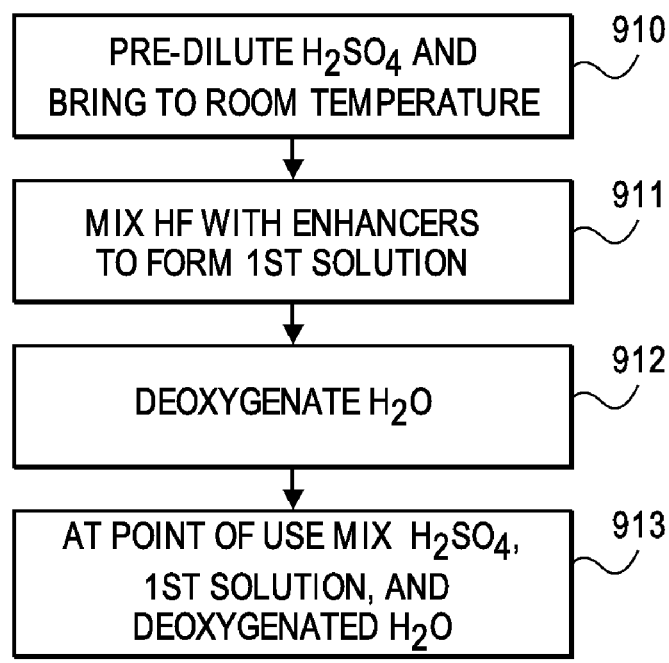

Another point use mixing embodiment is described in the flowchart in FIG. 9b. If the acid that will not oxidize copper is sulfuric acid, the sulfuric acid may be diluted with water prior to the point of use mixing at block 910. By using sulfuric acid that has been diluted to approximately 70% by weight, or less, sulfuric acid in water, the temperature of the cleaning solution at the point of use may be approximately room temperature when mixed because most of the heat created by the dilution of sulfuric acid in water would have been expended in the pre-dilution. At block 911, the HF is mixed with the enhancers to form a first solution. The first solution may be stored within one of the tanks 524. In another tank 524 the acid that will not oxidize copper is stored. In yet another tank, deionized water that may be deoxygenated at block 912 is stored. Before the surface of the wafer substrate 508 is to be cleaned, the first solution is mixed at block 913 with the acid that will not oxidize copper and the deionized water to form the cleaning solution.

In each of these embodiments where the cleaning solution is mixed at the point of use, the acid that will not oxidize copper and the enhancers are mixed at the point of use to prevent the degeneration of the chelating agent and the surfactant by the acid that will not oxidize copper. This is particularly true when the acid that will not oxidize copper is sulfuric acid. In an embodiment where the sulfuric acid has not been prediluted, the temperature of the cleaning solution upon mixing may be approximately 29° C.-35° C. The cleaning solution at this temperature may be cooled to room temperature before it is applied to the wafer. The cleaning solution may be mixed at point of use in the approximate range of 5 minutes-10 minutes before it is applied to the wafer substrate 508, and may be mixed up to an hour before the solution is applied to the wafer substrate 508.

The vias 740 may have small dimensions on the scale of less than 0.15 μm and are thus fragile structures that may be damaged during the application of megasonics. To minimize or eliminate the potential damage to the vias during the application of acoustic energy to the wafer substrate 508 during cleaning, a low surface tension cleaning solution formed of acetic acid or another low surface tension solvent may be used to clean the substrate 706. Because acetic acid has a lower surface tension than water the acoustic energy will cause cavitation of the cleaning solution that has less force than the cavitation of aqueous solutions. An acetic acid cleaning solution may be formulated for a single use. In an embodiment, the acetic acid solution may contain less than approximately 20% by weight water, and in a particular embodiment to clean a substrate having copper metallization the acetic acid solution may be between approximately 0% and 10% by weight water, and more particularly approximately 5% by weight. An acetic acid solution having less than 5% by weight water may not effectively clean the surface of a substrate having metallization and a low-k dielectric without a cavitation gas also dissolved into the cleaning solution. The cavitation gas may be hydrogen or nitrogen. An acetic acid solution having more than 20% by weight water may produce cavitation having too much force and may damage the substrate. Acetic acid is valuable for cleaning copper because acetic acid will remove copper oxide but not pure copper metal. The acetic acid cleaning solution is therefore selective to dissolving and etching copper oxide but not pure copper metal. The acetic acid cleaning solution may also include a surfactant. The surfactant may be a mixture of a polyoxyethylene ether surfactant and an ethoxylated alcohol surfactant. Acetic acid has several advantages including the ability to purchase 100% acid in liquid form, it is cheap, and it is easy to dispose of because it is environmentally safe. The acetic acid cleaning solution may be mixed at the point of use up to an hour before the solution is applied to the wafer substrate 508, and more particularly 5 minutes-10 minutes before the solution is applied to the wafer substrate 508. At the point of use the solution is mixed by mixing the acetic acid plus surfactant with deionized water. Before being applied to the wafer substrate 508, the acetic acid cleaning solution may be filtered.

In another embodiment, the cleaning solution that is applied to the substrate 706 may be dilute tetramethylammonium hydroxide (TMAH.) TMAH is a base that will not etch copper, and therefore may be used to clean a substrate containing copper. The TMAH cleaning solution may be formulated for a single use, meaning that it contains a very dilute amount of TMAH and enhancers, if they are present. The TMAH cleaning solution may be formed by diluting 5%-20% by weight TMAH with distilled water within the approximate range of 40:1-500:1 water to TMAH, and more particularly approximately 80:1 water to TMAH. The dilution may occur at the point of use. The enhancers may be a surfactant and a chelating agent. The surfactant may be a mixture of a polyoxyethylene ether surfactant and an ethoxylated alcohol surfactant. The chelating agent may be EDTA or EDDHA. The TMAH cleaning solution may also include a dissolved cavitation gas, such as hydrogen or nitrogen.

In an embodiment where an $H_2$ plasma ash was used to remove the photoresist 736 from the dielectric 700, the surface of the wafer substrate 508 may be pre-treated before cleaning with a solution to oxidize any metal, and in particular copper, residues on the surface of the wafer substrate 508. The oxidation of the metal residues may be needed because an $H_2$ plasma ash may reduce copper oxide (CuO) to pure copper ($Cu^{(0)}$). Therefore, because the cleaning solutions are formulated to remove copper oxide, the cleaning solutions may not be able to effectively dissolve pure copper residues. The cleaning solution may better clean the surface of the wafer substrate 508 if the copper residues are oxidized. The solution that may be used to oxidize copper residues may be a 5% by weight hydrogen peroxide in water solution or an ozonated deionized water solution. The ozonated deionized water may contain approximately 20 ppm of ozone.

At block 803 the wafer begins spinning. The spin rate of the wafer substrate 508 in this embodiment may be in the approximate range of 5 rpm-50 rpm, and more particularly less than 8 rpm. Once the wafer substrate 508 is spinning, single pass cleaning solutions or rinses may be applied to clean the top surface of the wafer substrate 508 for the post-via etch clean and to the bottom surface of the wafer substrate 508 for the backside pre-trench clean. The top surface of the wafer substrate 508 may be cleaned with any of the cleaning solutions described above to clean a surface of a wafer substrate 508 having metallization. These cleaning solutions include the aqueous cleaning solution formed of an acid that will not oxidize copper, hydrofluoric acid (HF), and water, a cleaning solution formed of a high percentage of acetic acid in combination with acoustic energy, or a cleaning solution formed of tetramethylammonium hydroxide (TMAH) and water. Approximately 200 mL-300 mL of the cleaning solution may be applied to either one side or both sides of the wafer substrate 508 for approximately 40 seconds. The top surface of the wafer substrate 508 and the bottom surface of the wafer substrate 508 may be cleaned with the same or with different cleaning solutions or rinses. The acoustic energy plate 502 is raised at block 805 to within approximately 3 mm of the wafer substrate 508 and acoustic energy is applied to the wafer substrate 508 at block 806 at a frequency of approximately 1 MHz while the cleaning solutions are on the wafer substrate 508 to enhance the cleaning of the surfaces of the wafer substrate 508.

Figure 5D:
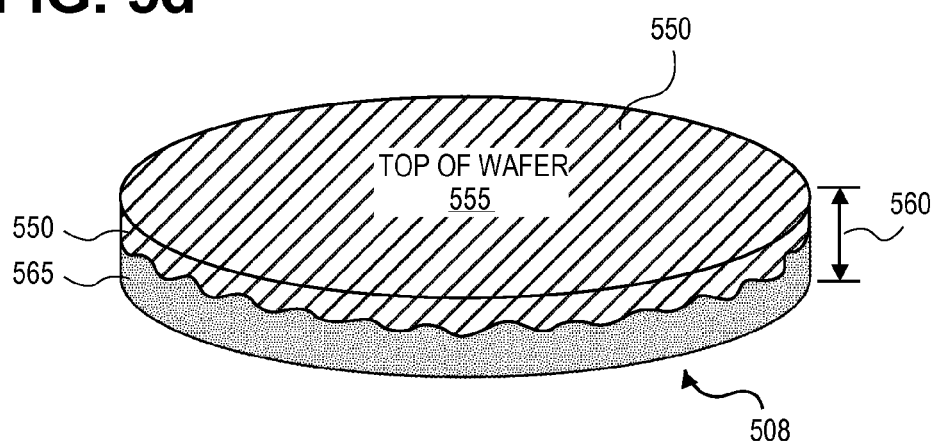
FIGS. 5d-5e are three-dimensional views of a wafer substrate coated by different cleaning solutions on the top and the bottom.
Figure 5E:
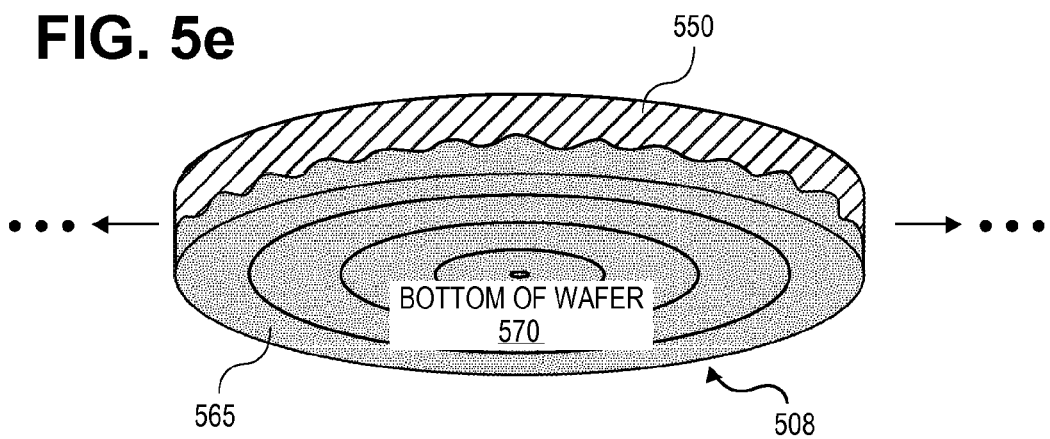

In a particular embodiment to clean the top surface of the wafer substrate 508 with a first cleaning solution that is different from the cleaning solution used to clean the bottom of the wafer substrate 508, the acoustic energy applied to the wafer substrate 508 is at a frequency that in combination with the spin rate is sufficient to coat the bottom side of the wafer substrate 508 with the cleaning or rinsing solution that is applied to the bottom of the wafer substrate 508. Coating the bottom side of the wafer substrate 508 with the cleaning or rinsing solution enables good separation of the cleaning solution applied to the top of the wafer substrate 508 and the cleaning or rinsing solution applied to the bottom of the wafer substrate 508, as illustrated in FIGS. 5d and 5e. FIG. 5d illustrates a first cleaning solution 550 coating the top 555 of the wafer substrate 508 and a portion of the bevel 560 of the wafer substrate 508 where it meets a second cleaning solution 565 that also coats a portion of the bevel. FIG. 5e illustrates the second cleaning solution coating the bottom 570 of the wafer substrate 508. The first and second cleaning solutions spin off of the wafer substrate 508 from the bevel 560 and mix once they drain into the bottom of the single substrate cleaning tool 500. The first cleaning solution 550 and the second cleaning solution 565 do not mix during the cleaning of the wafer substrate 508 because there is no splashing due to the coating of the bottom of the wafer with the second cleaning solution. Mixing of the solutions may also be reduced because the acoustic energy plate 502 blocks any splashing of solutions back onto the wafer substrate 508 after the solutions have been spun off of the wafer substrate 508. The spin rate of the wafer substrate 508 in this embodiment may be in the approximate range of 5 rpm-50 rpm, and more particularly less than 8 rpm. The frequency of the acoustic energy may be in the approximate range of 400 kHz and 3 MHz, and more particularly in the approximate range of 500 kHz and 1.5 MHz. In one particular embodiment, the acoustic energy has a frequency of approximately 1 MHz. The first solution 550 that is applied to the top 555 of the wafer substrate 508 may be any of the cleaning solutions formulated for a single use that are described above, or in the alternative an aqueous rinse solution. The second solution may be a cleaning solution formulated for a single use and tailored to aggressively clean residues from the metallization, the photoresist, and the low-k dielectric but to not dissolve or etch the semiconductor wafer substrate 508. Such a cleaning solution applied to the bottom of the wafer substrate 508 may be a mixture of ammonium hydroxide ($NH_4OH$), hydrogen peroxide ($H_2O_2$), water ($H_2O$), a chelating agent such as EDTA or EDDHA, and a surfactant. The second solution may also be a deionized water rinse.

At block 804, where single pass cleaning solutions are applied to the top and the bottom of the wafer substrate 508, the cleaning solution may be applied to the wafer substrate 508 for a short enough time to prevent absorption of a sufficient amount of oxygen by the cleaning solution to oxidize the copper metallization. In an embodiment, the cleaning solution may be applied to the wafer substrate 508 for less than 3 minutes, and more particularly for approximately 40 seconds. The use of deoxygenated water in the cleaning solution will increase the amount of time that the cleaning solution may be on a surface of the wafer substrate 508 before portions of the surface become oxidized. The amount of cleaning solution that is typically dispensed onto the surface of the wafer substrate 508 is approximately 200 ml-300 ml. While the cleaning solution or solutions are applied to the wafer substrate 508 the acoustic energy plate 502 is raised at block 805 and acoustic energy may be applied at block 806 to the wafer substrate 508 after the gap 518 is filled with a cleaning solution or a rinse. The gap 518 may be approximately 3 mm.

Figure 8:
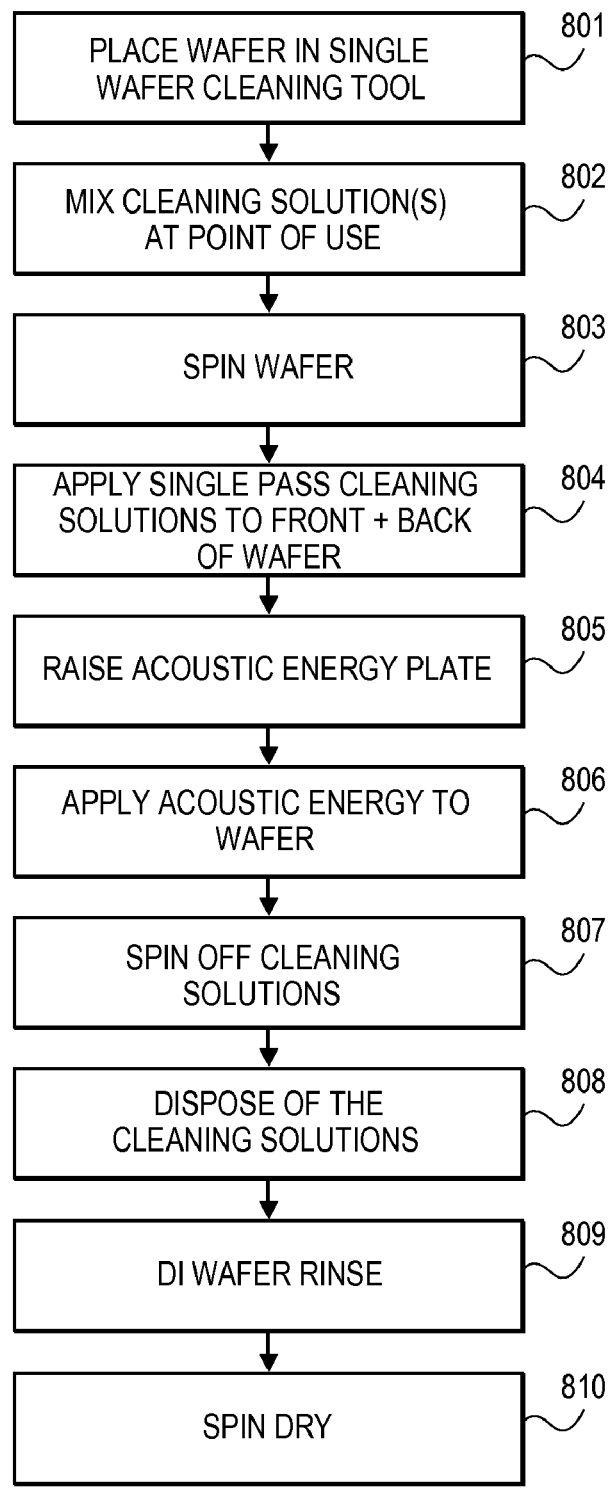
FIG. 8 is a flow chart of a cleaning process that may be used with back-end-of-the-line processing.

After cleaning the wafer substrate 508, the cleaning solution or solutions are spun off of the wafer substrate 508 at block 807 of FIG. 8 and the cleaning solution or solutions are then disposed of at block 808. The cleaning solution may be spun off of the wafer substrate 508 at a spin rate of approximately 250 rpm. A deionized water rinse is then applied to the wafer substrate 508, on both the top and the bottom of the wafer substrate 508, at block 809, for approximately 30-60 seconds. The deionized water rinse may be deoxygenated and may contain carbon dioxide gas to make the rinse slightly acidic. By using a slightly acidic rinse, corrosion of the metallization, and in particular the corrosion of copper, may be prevented. Copper is stable and may not be oxidized in a solution having an acidic pH up to approximately a pH of 6. In a preferred embodiment, the pH of the rinse is in the approximate range of 4-5. The carbon dioxide may be dissolved into the rinse ahead of time or in-line using a venturi device. Carbon dioxide gas also has the advantage of evaporating into the air and therefore will not leave a residue on the surface of the wafer substrate 508. In an embodiment, the rinse may be performed in the dark without exposing the wafer substrate 508 to frequencies of light having a band gap greater than that of silicon, that being 1.1 eV. The rinse may be performed in the dark to further prevent the oxidation of copper. The wafer substrate 508 is then spun dry at block 810 for approximately 30 seconds at a spin rate in the approximate range of 500 rpm and 1500 rpm, and more particularly approximately 1000 rpm.

Figure 7C:
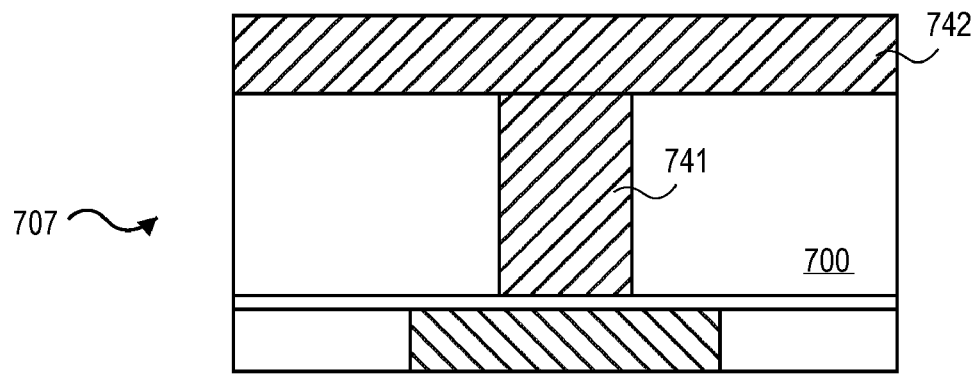
Figure 7C:
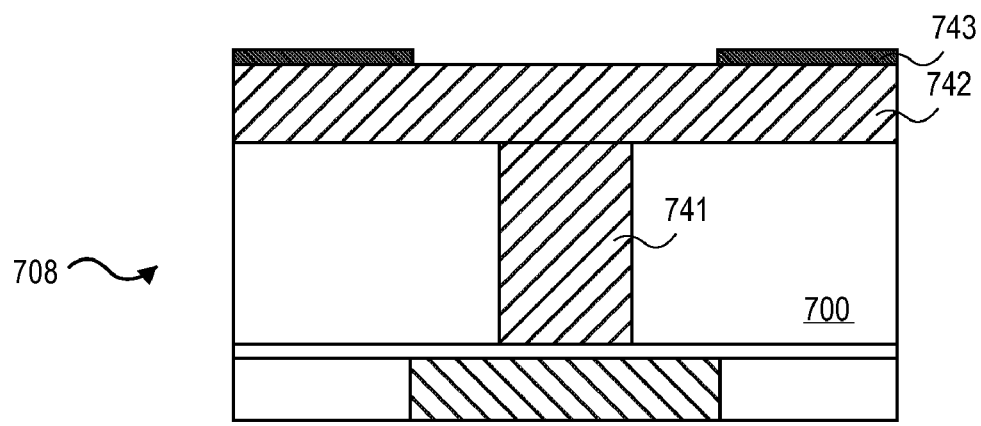
Figure 7C:
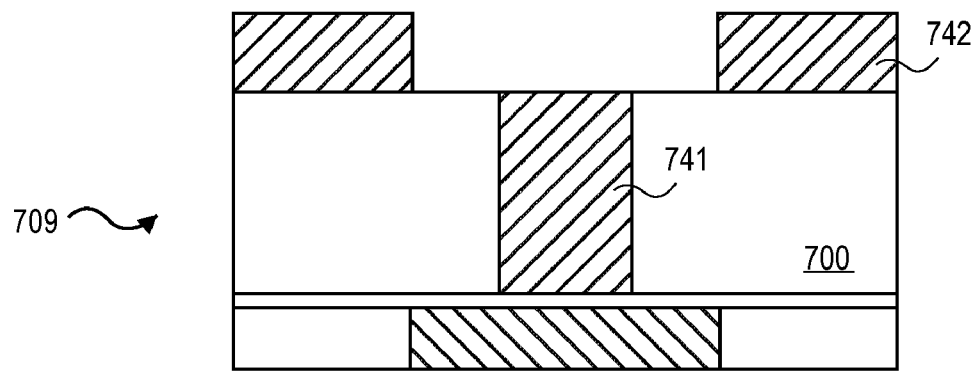
Figure 7D:
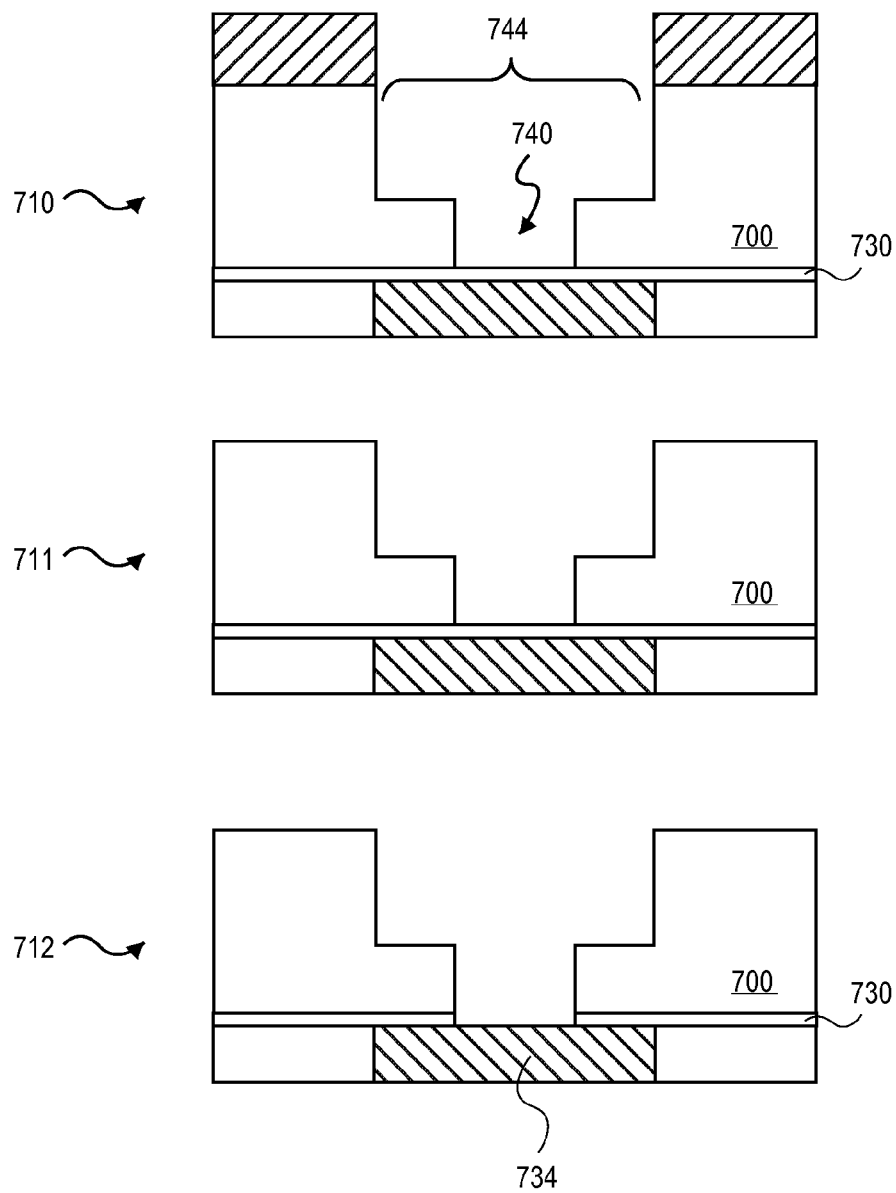
Figure 7E:
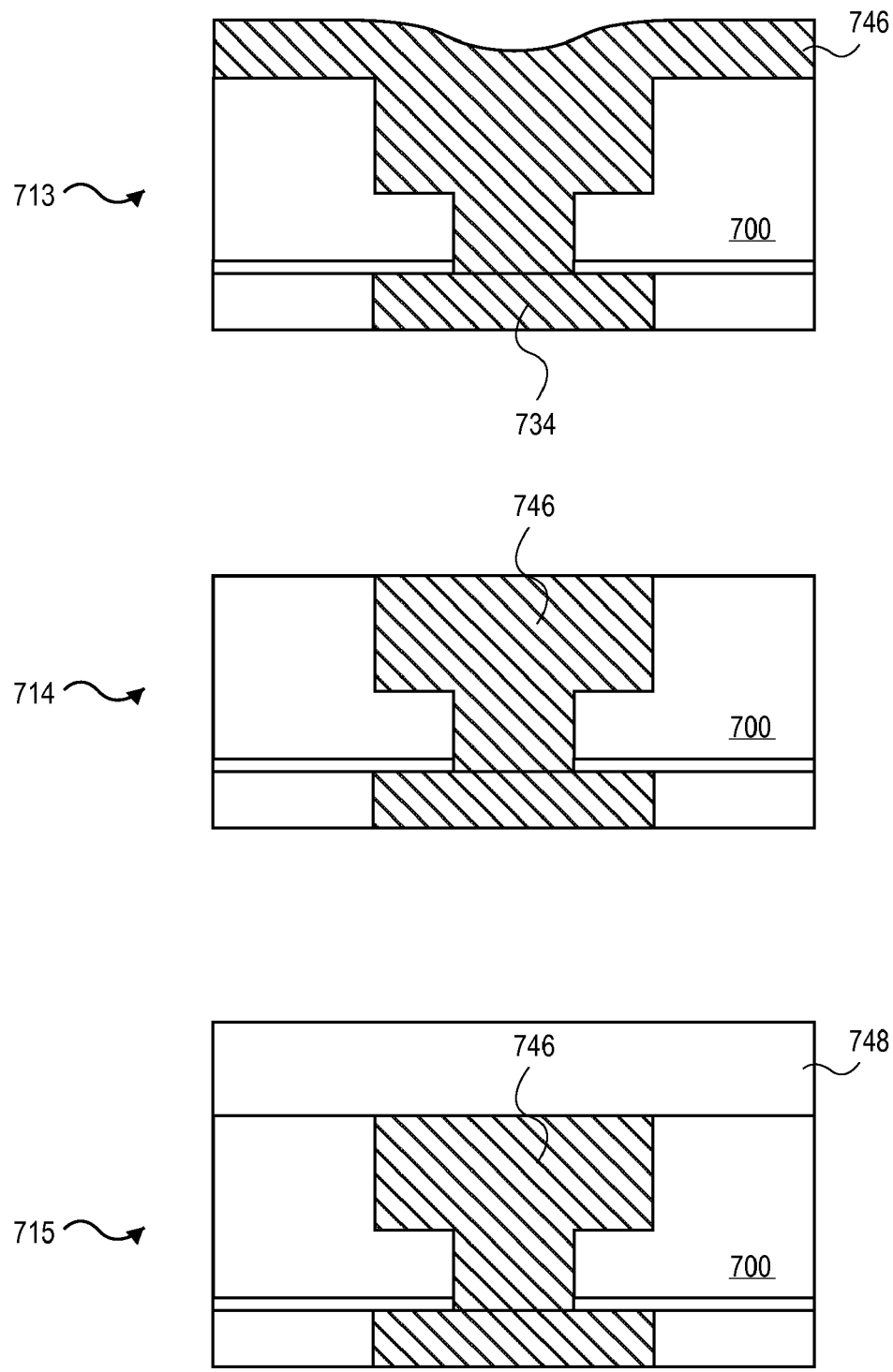

In an embodiment, at block 607 of FIG. 6a, a material such as a sacrificial light absorbing material (SLAM) 741 is deposited into the via 740. SLAM 741 is a material that absorbs light used to pattern the photoresist and may be etched at the same rate as the dielectric. A photoresist 742 may now be deposited over the via 740 and over the low-k dielectric layer 700, as illustrated at 707 of FIG. 7c. At 708 the photoresist 742 is masked, and at 709 the photoresist is patterned. The low-k dielectric layer 700 and the SLAM 741 is then etched at block 608 to form the trench 744 over the via 740, as illustrated at 710 of FIG. 7d. At block 609 the photoresist is removed, as illustrated at 711. At block 610, a frontside post-trench etch clean is performed on the substrate surface of 711 in the single substrate cleaning tool 500 as described above. This clean may be performed in a single substrate cleaning tool 500 using any of the cleaning solutions described above for the frontside post-via etch clean. The backside of the wafer substrate 508 may optionally also be cleaned or rinsed at this point. After cleaning, rinsing, and drying the wafer substrate 508, the wafer substrate 508 is transferred out of the single substrate cleaning tool 500 to an etching chamber to remove the etch stop layer 730 at block 611 from the bottom of the via 740 as illustrated at 712 in FIG. 7c. After removing the etch stop layer at block 611, a frontside post-etch stop removal clean and a backside pre-critical dimension (CD) inspection clean may be performed at block 612. These cleans of the top and the bottom of the wafer substrate 508 may be done at the same time with different solutions using the methods and solutions described above for cleaning a substrate having metallization. At block 613 a critical dimension inspection of the vias and the trenches is performed. Next, at block 614 and illustrated in FIG. 7e at 713, the via 740 and the trench 744 are filled with a conductive metal 746, such as copper, by electroplating. The electroplating of copper is typically performed over a copper seed layer (not illustrated) and a copper diffusion barrier that may be formed of tantalum. At block 615 the copper layer 746 is planarized by chemical mechanical polishing (CMP) to remove the excess copper, as illustrated at 714 in FIG. 7e. After the CMP, the wafer substrate 508 may be cleaned on the top and the bottom at block 616 to remove residues from the CMP process including copper and low-k dielectric residues. One complete layer of metallization has just been described. In a typical integrated circuit process there may be multiple layers of metallization and the metallization sequence may be repeated at block 617.

Figure 6C:
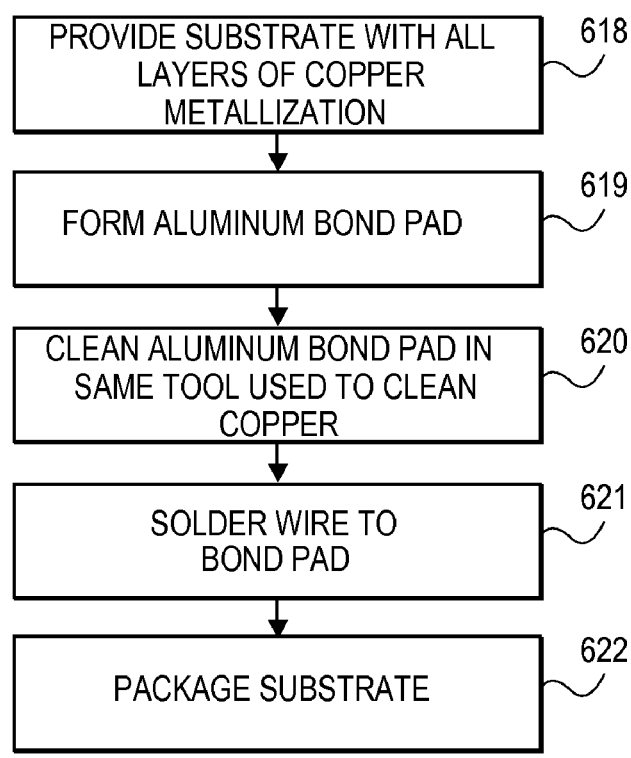
Figure 7F:
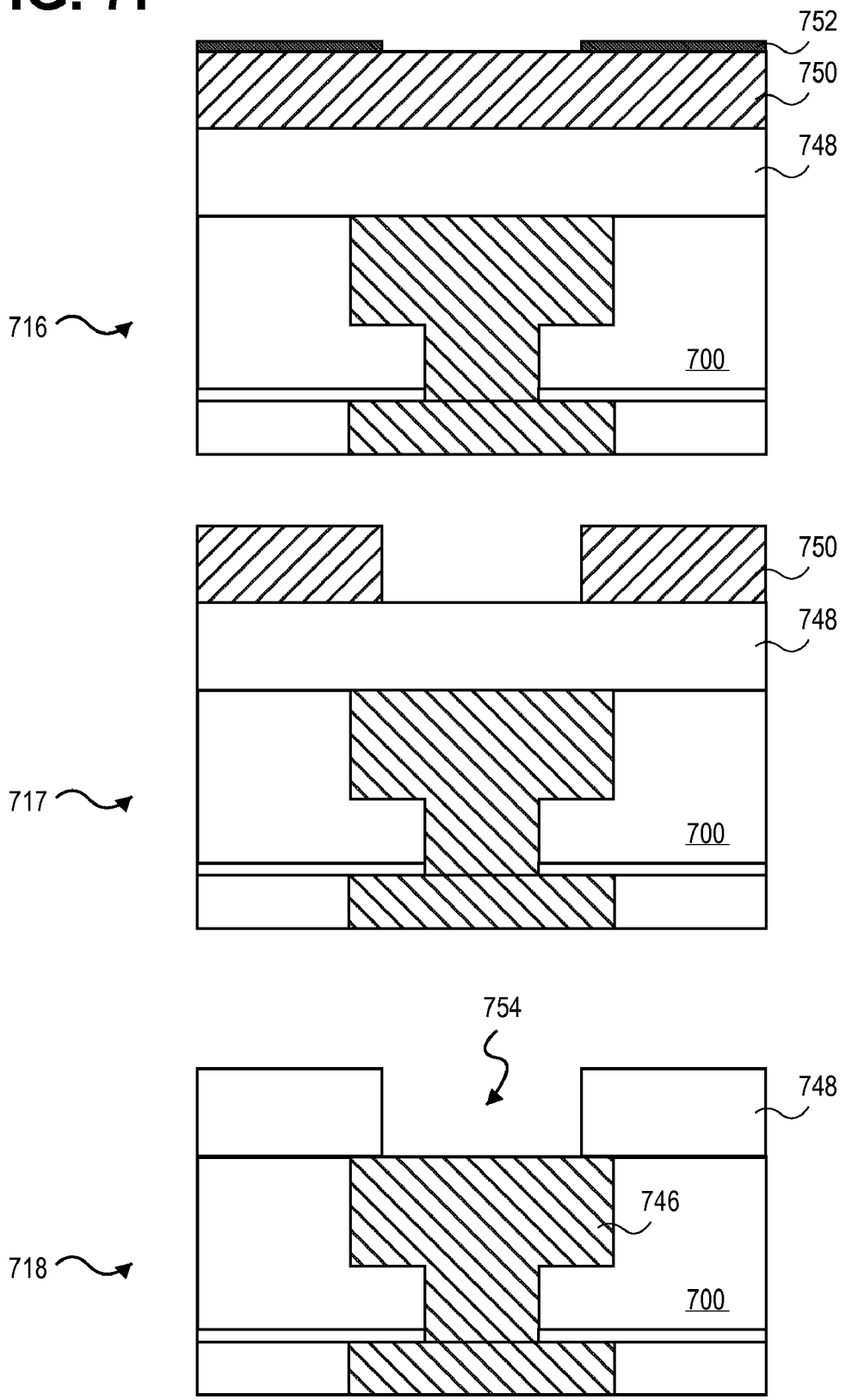
Figure 7G:
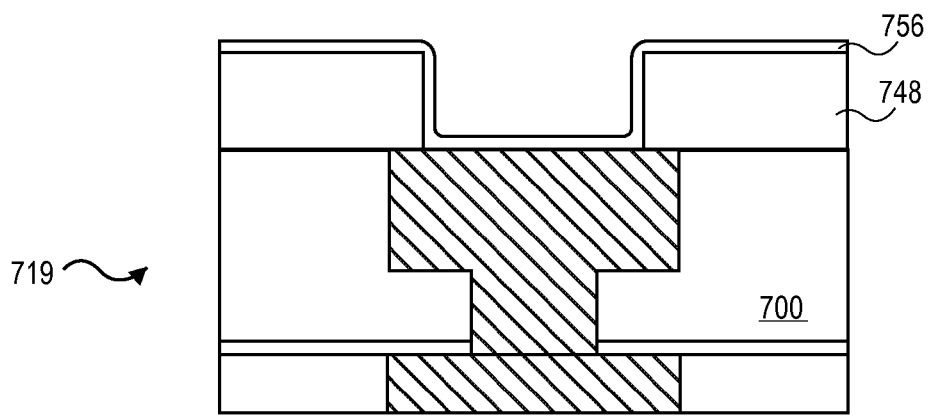
Figure 7G:
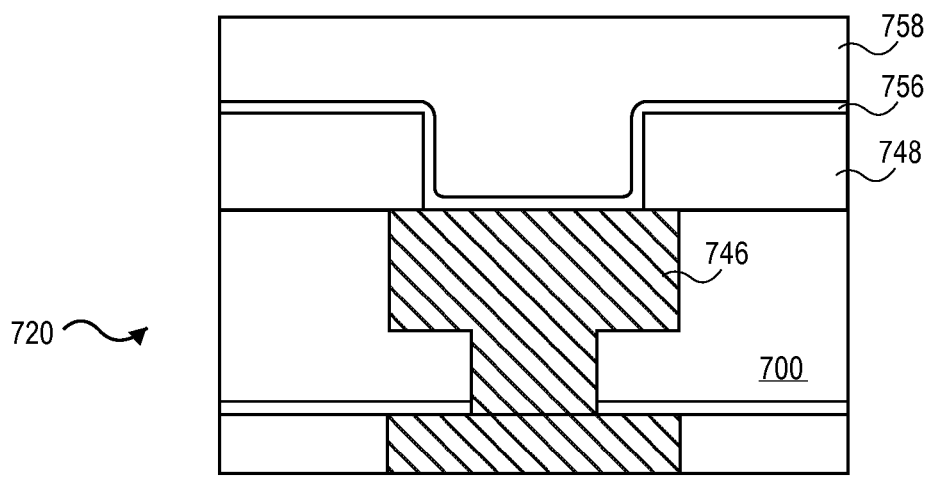
Figure 7H:
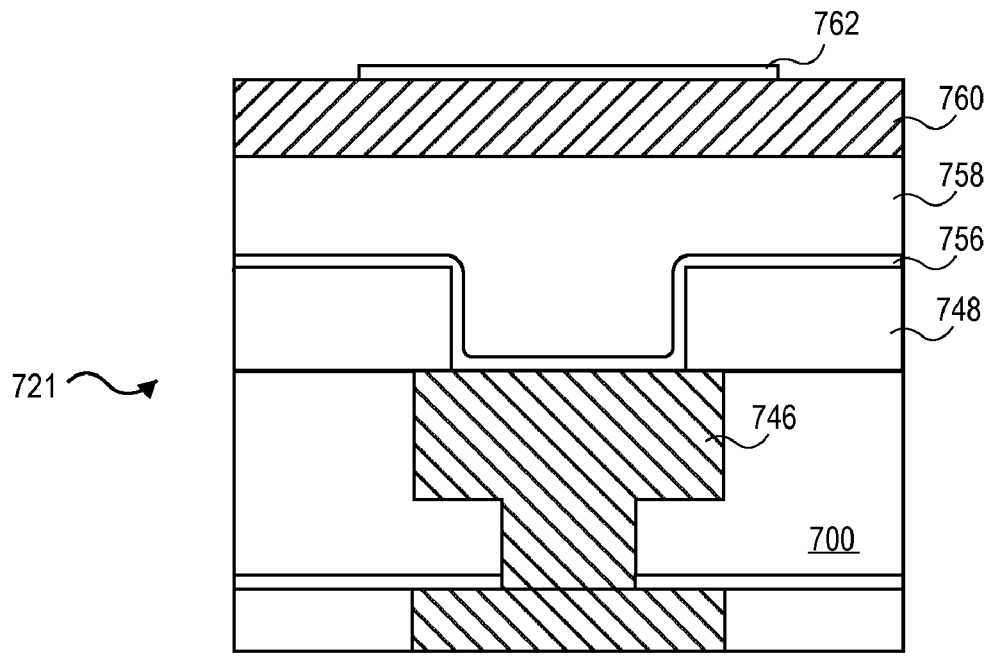
Figure 7H:
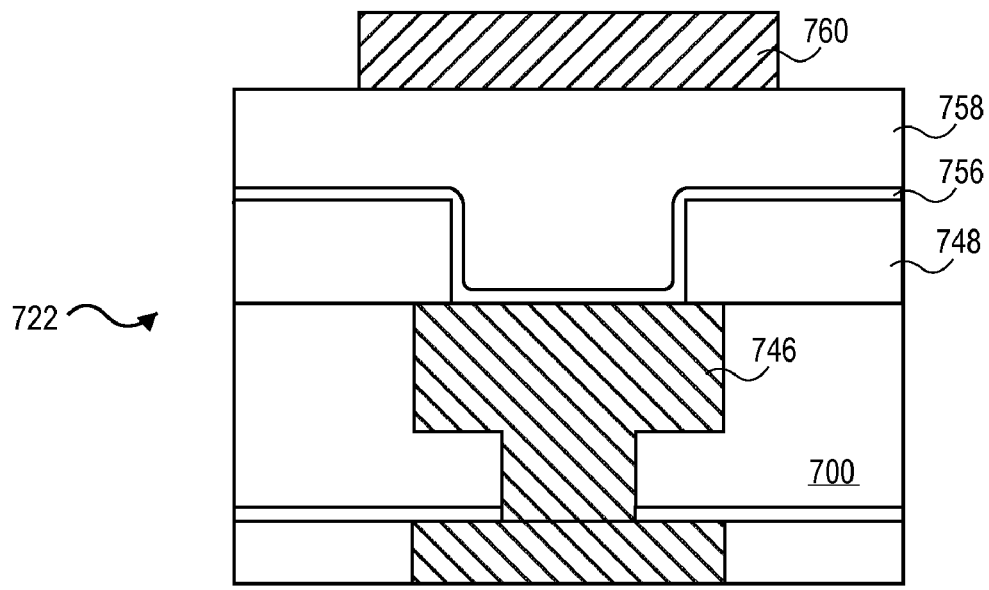
Figure 7I:
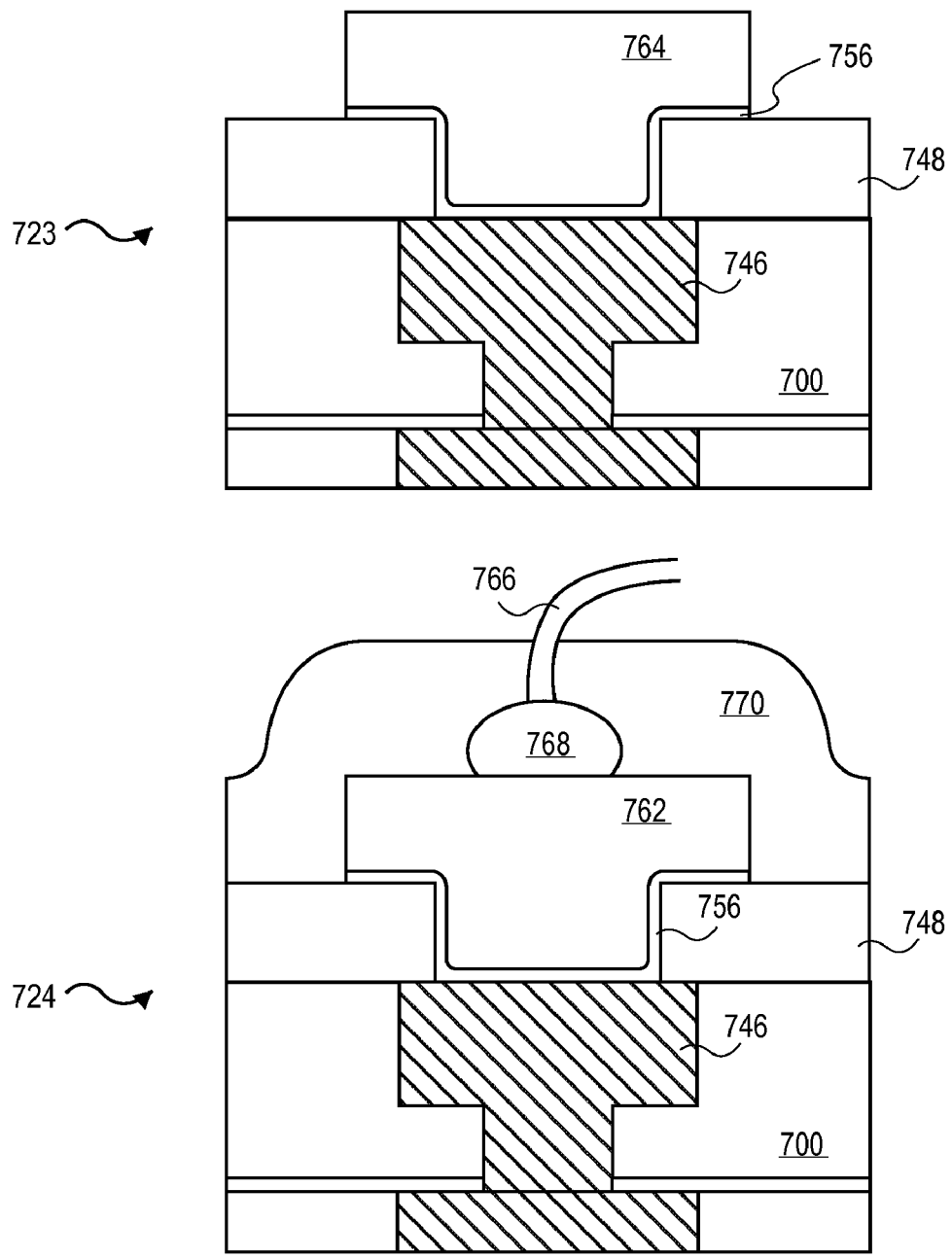

Over the last interconnect metallization layer, provided at block 618 of FIG. 6c, a bond pad may be formed at block 619. In this embodiment, the bond pad is aluminum, but it is to be understood that the bond pad may be other types of metals. As illustrated at 715 in FIG. 7e, a dielectric layer 748 may be deposited by chemical vapor deposition over the last layer of metallization. The dielectric layer 748 may be silicon dioxide. At 716 of FIG. 7f, a photoresist 750 is then formed over the dielectric layer 748 and a mask 752 is formed over the photoresist. At 717, the photoresist is patterned and the dielectric is then etched to form the opening 754 that exposes copper interconnect line 746, as illustrated at 718. The substrate may now be transferred into an aluminum deposition chamber. As illustrated at 719 of FIG. 7g, a titanium nitride (TiN) layer may be formed over the dielectric 748 by chemical vapor deposition. An aluminum layer 758 may then be deposited over the TiN layer 756 to form the substrate at 720. A photoresist 760 is then formed over the aluminum layer 758 and masked with mask 762 as illustrated at 721 in FIG. 7h. The photoresist 760 is patterned as illustrated by the structure at 722. The structure 723 of FIG. 7i illustrates the aluminum layer 758 after it is etched and the photoresist 760 is removed to form the aluminum bond pad 764. The substrate illustrated at 723 in FIG. 7i may now be cleaned in the same single substrate cleaning tool 500 in which the copper interconnect lines and vias were cleaned. Similar to the methods described above, the wafer substrate 508 on which the structure 723 is formed is transferred into the single substrate cleaning tool 500 where the wafer substrate 508 is supported on elastomeric pads on wafer support 510 and held in place by gravity.

The wafer substrate 508 is spun after it is placed in the single wafer cleaning tool 500. The wafer support 510 may horizontally rotate or spin wafer substrate 508 about its central axis at a rate of between 0 rpm-6000 rpm, and more particularly in the approximate range of 5 rpm and 1500 rpm. Additionally, in apparatus 500, wafer substrate 508 may be placed face up with the side of the wafer substrate 508 with the aluminum bond pads faces towards a nozzle 514 for spraying or dispensing cleaning chemicals thereon, and the backside of the wafer substrate 508 faces plate 502. The plate 502 is raised after the wafer substrate 508 begins spinning and a cleaning solution is flowed through conduit 516 to fill the space 518 between the wafer substrate 508 and the plate 502. The cleaning solution used to clean the aluminum bond pads may be a variation on the sulfuric acid, HF, water, and enhancers cleaning solution described above to clean copper. To clean aluminum, the solution may also contain hydrogen peroxide to oxidize the aluminum. Also, in this embodiment, the water may not be deoxygenated because the aluminum may be oxidized. The cleaning solution may be formulated for a single use and therefore contains approximately 0.1%-10% by weight of the concentrated chemicals including the sulfuric acid, the HF, and the enhancers, in water. The amounts of the individual components may be: approximately 0.5%-10% by weight, and more particularly 5%, sulfuric acid; and approximately 150 ppm-3000 ppm HF. In an embodiment, hydrogen peroxide may also be part of the cleaning solution. The sulfuric acid may be prediluted to approximately 70% by weight or less sulfuric acid in water before the sulfuric acid is mixed into the cleaning solution. The cleaning solution may be mixed at the point of use. Once the cleaning solution is on the wafer substrate 508, acoustic energy may be applied to the wafer substrate 508 by the acoustic energy plate 502 through a second cleaning solution or a rinse solution that fills the gap between the acoustic energy plate 502 and the wafer substrate 508. As described above for the copper cleaning embodiments, both the topside and the bottom side of the wafer substrate 508 may be cleaned at the same time with different cleaning solutions. The cleaning solution and the acoustic energy may be applied to the wafer substrate 508 for approximately 30 seconds and then spun off of the wafer substrate 508. The wafer substrate 508 may be rinsed with a distilled water rinse for approximately 30 seconds after the cleaning and then spin-dried for approximately 30 seconds at a spin rate in the approximate range of 500 rpm and 1500 rpm. After the cleaning sequence is complete, the aluminum bond pad 762 may be soldered by a solder 768 to a wire 766. The substrate 724 is then packaged within a plastic coating 770.

It is to be appreciated that the disclosed specific embodiments are only meant to be illustrative of the present invention and one of ordinary skill in the art will appreciate the ability to substitute features or to eliminate disclosed features. As such, the scope of the Applicant's invention are to be measured by the appended claims that follow.

We claim:

1. A method, comprising:
providing a substrate in a single substrate cleaning apparatus;
applying a first cleaning solution which may dissolve copper oxide (CuO) but not dissolve or etch pure copper metal ($Cu^{(o)}$) to a top side surface of the substrate comprising an exposed low-k dielectric layer surface and an exposed metal layer surface, the first cleaning solution containing an acid that does not oxidize copper, 150 to 3000 ppm HF, and water; wherein the metal layer surface is not oxidized while applying the first cleaning solution;
disposing of the first cleaning solution after a first use of the first cleaning solution;
applying a second cleaning solution to a bottom side of the substrate; and
disposing of the second cleaning solution after a first use of the second cleaning solution.

2. The method of claim 1, wherein the metal is copper.

3. The method of claim 1, wherein the acid that does not oxidize copper is sulfuric acid.

4. The method of claim 1, wherein the first cleaning solution comprises acetic acid and 5-10% by weight water.

5. The method of claim 1, wherein the metal is aluminum.

6. The method of claim 1, wherein applying the second cleaning solution to the bottom side of the substrate comprises flowing the second solution onto a silicon based material.

7. The method of claim 6, wherein flowing the second solution onto the silicon based material comprises flowing a solution comprising $NH_4OH$, $H_2O_2$, and water onto the silicon based material.

8. The method of claim 6, wherein flowing the second solution onto the silicon based material comprises flowing a solution comprising deionized water and carbon dioxide onto the silicon based material.

9. The method of claim 1, further comprising applying acoustic energy to the substrate by applying megasonics with a megasonic plate to the second solution between the substrate and the megasonic plate positioned under the substrate.

10. The method of claim 9, further comprising spinning the substrate and coating the bottom side of the substrate with the second solution.

11. The method of claim 10, wherein applying acoustic energy to the substrate, spinning the substrate, and coating the bottom side of the substrate with the second solution cleans a bevel of the substrate.

12. The method of claim 10, wherein the spin rate is in the range of 5 rpm and 50 rpm.

13. The method of claim 10, wherein the spin rate is 8 rpm or less.

14. The method of claim 9, wherein applying acoustic energy to the substrate comprises applying megasonics in the range of 400 kHz and 3 MHz.

15. The method of claim 9, wherein applying acoustic energy to the substrate comprises applying megasonics in the range of 500 kHz and 1500 kHz.

16. The method of claim 9, wherein applying acoustic energy to the substrate comprises applying megasonics of 925 kHz.

17. The method of claim 1, wherein applying the first cleaning solution to the top side surface of the substrate is simultaneous to applying the second cleaning solution to the bottom side of the substrate.

18. The method of claim 1, wherein the acid that does not oxidize copper is selected from the group consisting of sulfuric acid, oxalic acid, citric acid, hydrogen chloride, dichloroacetic acid, trichloroacetic acid, and acetic acid.

19. The method of claim 18, wherein the first cleaning solution comprises acetic acid and 5% by weight water.

* * * * *